United States Patent
Liu et al.

(10) Patent No.: US 10,914,798 B2
(45) Date of Patent: *Feb. 9, 2021

(54) EIGEN-VECTOR APPROACH FOR COIL SENSITIVITY MAPS ESTIMATION

(71) Applicant: Siemens Healthcare GmbH, Erlangen (DE)

(72) Inventors: Jun Liu, Cary, NC (US); Hui Xue, Franklin Park, NJ (US); Marcel Dominik Nickel, Erlangen (DE); Ti-chiun Chang, Princeton Junction, NJ (US); Mariappan S. Nadar, Plainsboro, NJ (US); Alban Lefebvre, Jersey City, NJ (US); Edgar Mueller, Heroldsbach (DE); Qiu Wang, Princeton, NJ (US); Zhili Yang, West Windsor, NJ (US); Nirmal Janardhanan, Plainsboro, NJ (US); Michael Zenge, Nuremberg (DE)

(73) Assignee: Siemens Healthcare GmbH, Erlangen (DE)

(*) Notice: Subject to any disclaimer, the term of this patent is extended or adjusted under 35 U.S.C. 154(b) by 58 days.

This patent is subject to a terminal disclaimer.

(21) Appl. No.: 14/038,958

(22) Filed: Sep. 27, 2013

(65) Prior Publication Data
US 2014/0088899 A1 Mar. 27, 2014

Related U.S. Application Data

(63) Continuation of application No. 13/779,999, filed on Feb. 28, 2013, now abandoned.
(Continued)

(51) Int. Cl.
*G01R 27/00* (2006.01)
*G01D 18/00* (2006.01)
(Continued)

(52) U.S. Cl.
CPC ......... *G01R 33/243* (2013.01); *G01R 33/246* (2013.01); *G01R 33/5611* (2013.01)

(58) Field of Classification Search
CPC .. G01R 33/243; G01R 33/246; G01R 35/005; G01R 27/02
(Continued)

(56) References Cited

U.S. PATENT DOCUMENTS 6,949,928 B2 * 9/2005 Gonzalez Ballester ............
G01R 33/5611
324/307
7,254,435 B2 * 8/2007 Zhang et al. ............. 600/410
(Continued)

FOREIGN PATENT DOCUMENTS

CN 1809759 A 7/2006
CN 1827039 A 9/2006
(Continued)

OTHER PUBLICATIONS

University of Minnesota Duluth, "SVD Computation Example", Dec. 8, 2008.*
(Continued)

*Primary Examiner* — Michael P Nghiem

(57) ABSTRACT

A method for estimating a coil sensitivity map for a magnetic resonance (MR) image includes providing a matrix A of sliding blocks of a 3D image of coil calibration data, calculating a left singular matrix $V_{\|}$ from a singular value decomposition of A corresponding to τ leading singular values, calculating $P = V_{\|}V_{\|}^H$, calculating a matrix that is an inverse Fourier transform of a zero-padded matrix P, and solving $M^H c^r = (S^r)^H c^r$ for $c^r$, where $c^r$ is a vector of coil sensitivity maps for all coils at spatial location r, and
(Continued)

$$M = \left( \begin{pmatrix} 1 & 1 & \dots & 1 \\ 0 & 0 & \dots & 0 \\ \dots & \dots & & \dots \\ 0 & 0 & \dots & 0 \end{pmatrix} \begin{pmatrix} 0 & 0 & \dots & 0 \\ 1 & 1 & \dots & 1 \\ \dots & \dots & & \dots \\ 0 & 0 & \dots & 0 \end{pmatrix} \dots \begin{pmatrix} 0 & 0 & \dots & 0 \\ 0 & 0 & \dots & 0 \\ \dots & \dots & & \dots \\ 1 & 1 & \dots & 1 \end{pmatrix} \right).$$

14 Claims, 10 Drawing Sheets

Related U.S. Application Data

(60) Provisional application No. 61/724,023, filed on Nov. 8, 2012, provisional application No. 61/724,001, filed on Nov. 8, 2012, provisional application No. 61/618,002, filed on Mar. 30, 2012.

(51) Int. Cl.
  *G01P 21/00* (2006.01)
  *G01R 35/00* (2006.01)
  *G01R 33/24* (2006.01)
  *G01R 33/561* (2006.01)

(58) Field of Classification Search
  USPC .................................................... 702/65, 85
  See application file for complete search history.

(56) References Cited

U.S. PATENT DOCUMENTS

| | | | |
|---|---|---|---|
| 2002/0074999 A1* | 6/2002 | Katscher | G01R 33/5611 324/307 |
| 2003/0228043 A1* | 12/2003 | Ikezaki | G01R 33/5611 382/131 |
| 2004/0000906 A1 | 1/2004 | King et al. | |
| 2005/0270024 A1* | 12/2005 | Lin | G01R 33/5611 324/307 |
| 2006/0155798 A1* | 7/2006 | Ketchum | G06F 17/16 708/607 |
| 2008/0054899 A1* | 3/2008 | Aksoy et al. | 324/307 |
| 2008/0100292 A1* | 5/2008 | Hancu | 324/307 |
| 2010/0117644 A1* | 5/2010 | Nimbargi | G01R 33/561 324/309 |
| 2010/0222666 A1* | 9/2010 | Foo | A61B 5/055 600/413 |
| 2012/0007600 A1* | 1/2012 | Boernert et al. | 324/310 |
| 2013/0099786 A1* | 4/2013 | Huang et al. | 324/309 |
| 2013/0181711 A1* | 7/2013 | Chaari | G01R 33/5611 324/309 |
| 2013/0289912 A1* | 10/2013 | Liu et al. | 702/65 |
| 2014/0035576 A1* | 2/2014 | Li | G01R 33/5611 324/309 |

FOREIGN PATENT DOCUMENTS

| | | |
|---|---|---|
| JP | H0622930 A | 2/1994 |
| JP | 2002177245 A | 6/2002 |
| WO | WO 2010113062 | * 10/2010 |
| WO | WO 2012001583 | * 5/2012 |

OTHER PUBLICATIONS

Definition of equation, Web Dictionary, printed May 2017.*
CN Office Action in CN Patent Application No. 201310548403.5, dated Apr. 5, 2016, 8 pages.

* cited by examiner

TABLE I
Notations

| Symbol | Property | Description |
|---|---|---|
| $n_c$ | scalar | Number of coils |
| $n_x \times n_y$ | $n_x \times n_y$ | Size of 2D image |
| $k_x \times k_y$ | $k_x \times k_y$ | Calibration kernel size |
| m | $n_x n_y \times 1$ | 2D MRI Image |
| $c_i$ | $n_x n_y \times 1$ | Coil sensitivity map of the $i$-th coil |
| $r$ | scalar | Spatial location in the image (1 to $n_x n_y$) |
| $t$ | scalar | Spatial location in the image block (1 to $k_x k_y$) |
| $c_i^r$ | scalar | The value of $c_i$ at the spatial location $r$ |
| $x_i^r$ | scalar | The value of $x_i$ at the spatial location $r$ |
| $c^r$ | $n_c \times 1$ | The values of $c_1, c_2, \ldots, c_{n_c}$ at the spatial location $r$ |
| $x_i$ | $n_x n_y \times 1$ | The $k$-space data of the $i$-th coil, $\mathcal{F}^H(x_i) = m \otimes c_i$ |
| F | operator | Forward Fourier transformation |
| $F^H$ | operator | Backward Fourier transformation |
| $\otimes$ | operator | Component-wise multiplication |
| $P_i$ | operator | Zero Padding |

FIG. 1

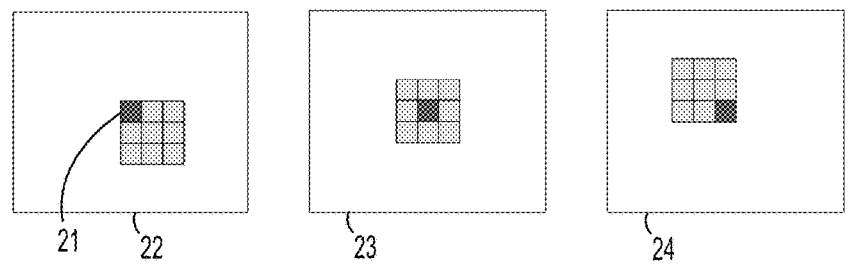

FIG. 2

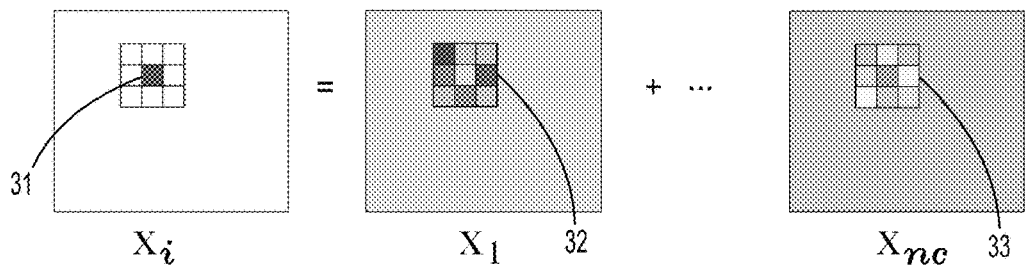

FIG. 3

TABLE II

COMPUTATION AND STORAGE COST

|  | $S^r$ | $M(S^r)^H$ | $S_r(S^r)^H$ |
| --- | --- | --- | --- |
| # of Fourier Transforms | $n_c^2 k_x k_y$ | $\dfrac{n_c(n_c+1)}{2}$ | $n_c \tau$ |
| storage | $O(n_c^2 k_x k_y n_x n_y)$ | $O(n_c^2 n_x n_y)$ | $O(n_c^2 n_x n_y)$ |

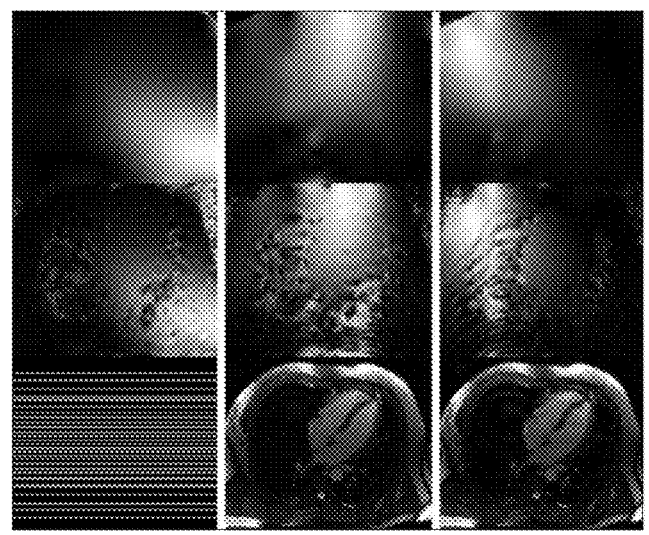
FIG. 9
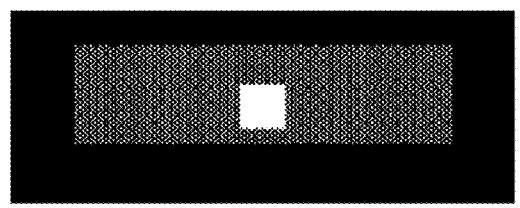
(a)
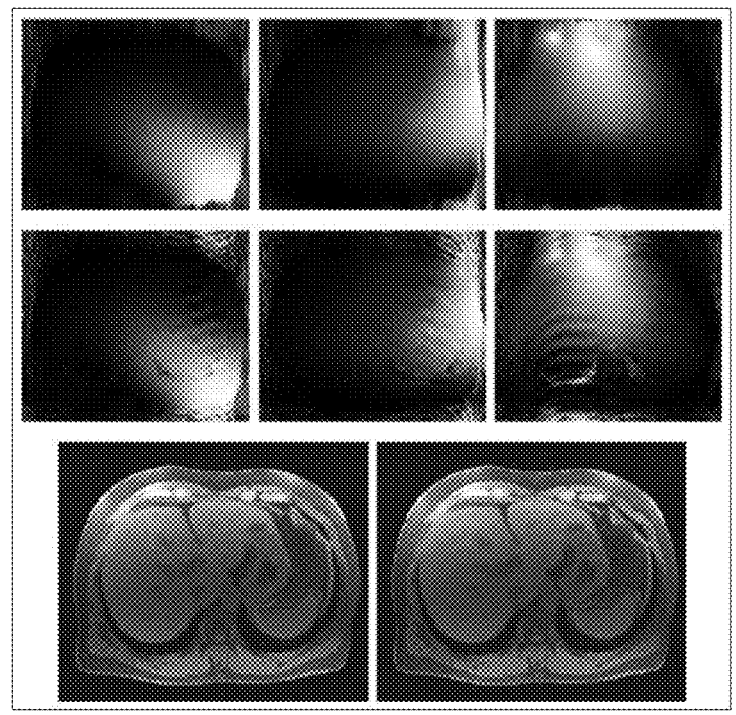
(b)
FIG. 10

EIGEN-VECTOR APPROACH FOR COIL SENSITIVITY MAPS ESTIMATION

CROSS REFERENCE TO RELATED UNITED STATES APPLICATIONS

This application is a continuation of, and claims priority from U.S. application Ser. No. 13/779,999, now abandoned, filed in the U.S. Patent and Trademark Office on Feb. 28, 2013, which in turn claims priority from "On the Eigen-Vector Approach for Coil Sensitivity Maps Estimation", U.S. Provisional Application No. 61/618,002 of Liu, et al., filed Mar. 30, 2012, "Coil Sensitivity maps Estimation in Dynamic CMRI: Square Could be Better than Rectangular", U.S. Provisional Application No. 61/724,023 of Liu, et al., filed Nov. 8, 2012, and "An Eigen-Vector Approach for Coil Sensitivity Estimation in the 3D Scenario", U.S. Provisional Application No. 61/724,001 of Liu, et al., filed Nov. 8, 2012, the contents of all of which are herein incorporated by reference in their entireties.

TECHNICAL FIELD

This disclosure is directed to methods for estimating coil sensitivity maps (CSM) of magnetic resonance imaging (MRI) apparatuses.

DISCUSSION OF THE RELATED ART

Parallel imaging makes use of multiple receiver coils to acquire the image in parallel. It can be used to accelerate the image acquisition by exploiting the spatially varying sensitivities of the multiple receiver coils since each coil image is weighted differently by the coil sensitivity maps (CSM). The accurate estimation of coil sensitivity maps can ensure the success of approaches that make use of the sensitivity maps either in the reconstruction formulation or in coil combination. Some methods explicitly make use of the coil sensitivities in reconstruction, and the goodness of the CSM's is important to the quality of the reconstructed image. Other approaches implicitly make use of the coil sensitivities by performing an auto-calibrating coil-by-coil reconstruction, but the CSM's are needed if one wants to obtain the coil combined complex image or the phase image.

The most common way to determine the sensitivity maps is to obtain low-resolution pre-scans. However, when the object is not static, the sensitivity functions are different between pre-scan and under-sampled scans, and this could lead to reconstruction errors. To compensate for this, joint estimation approaches have been proposed, however, these approaches usually have high computation cost and are restricted to explicit reconstructions.

The eigenvector approach proposed tries to build a connection between implicit and explicit approaches, by showing that the CSM can be computed with the auto-calibrated coil-by-coil reconstruction. It has been shown that the coil sensitivities can be computed as the eigenvector of a given matrix in the image space corresponding to the eigenvalue's '1''s. However, to the best of the inventor's knowledge: (1) the detailed mathematical derivations for the eigenvector approach are not well understood; (2) the optimization criterion for computing the CSM is not very clear; and (3) there lacks an efficient approach.

SUMMARY

Exemplary embodiments of the invention as described herein generally include methods for coil sensitivity maps (CSM) estimation for 2-D MR images. Embodiments of the invention mathematically derive an eigenvector approach and show that the coil sensitivity maps at a given spatial location can be obtained by solving a generalized eigenvalue system. Embodiments of the invention establish relationships between the generalized eigenvalue system and two related eigenvalue systems where the associated matrices are Hermitian. Embodiments of the invention can reduce the computational and storage costs and avoid the computation of large matrices by using equivalent representations. Experimental results on simulated and real data sets show that, a method according to an embodiment of the invention can obtain CSM's with high quality and the resulting reconstructed images have fewer artifacts compared to those reconstructed with CSM's obtained by a B1-Map.

According to an aspect of the invention, there is provided a method for estimating a coil sensitivity map for a magnetic resonance (MR) image, including constructing a matrix $A=\{a_{ij}\}$ from a 3D $c_x \times c_y \times c_z$ image of coil calibration data by gathering sliding blocks of kernel size $k_x \times k_y \times k_z$, wherein A has $[(c_x-k_x+1)\times(c_y-k_y+1)\times(c_z-k_z+1)]$ columns and $k_x k_y k_z n_c$ rows, $n_c$ is a number of coils, and $a_{i,j}$ is a $k_x k_y k_z \times 1$ column vector that represents a jth sliding block of an ith coil, determining a unit eigenvector $\alpha$ that maximizes $\langle (S^r)^H \alpha, M^H \alpha \rangle$, wherein $S^r$ is an inverse Fourier transform of a zero-padded matrix $P=V_{\parallel} V_{\parallel}^H$ at spatial location r in the 3D $c_x \times c_y \times c_z$ image, wherein $$V_{\parallel} = [v_1, v_2, \ldots, v_\tau] = \begin{pmatrix} v_{1,1} & v_{1,2} & \cdots & v_{1,\tau} \\ v_{2,1} & v_{2,2} & \cdots & v_{2,\tau} \\ \cdots & \cdots & & \cdots \\ v_{n_c,1} & v_{n_c,2} & \cdots & v_{n_c,\tau} \end{pmatrix}$$

is a matrix composed of left singular vectors of A corresponding to $\tau$ leading singular values wherein $V_{i,k}$ is a $k_x k_y k_z \times 1$ column vector that is an i-th block in vector $v_k$, $$M = \left( \begin{pmatrix} 1 & 1 & \cdots & 1 \\ 0 & 0 & \cdots & 0 \\ \cdots & \cdots & & \cdots \\ 0 & 0 & \cdots & 0 \end{pmatrix} \begin{pmatrix} 0 & 0 & \cdots & 0 \\ 1 & 1 & \cdots & 1 \\ \cdots & \cdots & & \cdots \\ 0 & 0 & \cdots & 0 \end{pmatrix} \cdots \begin{pmatrix} 0 & 0 & \cdots & 0 \\ 0 & 0 & \cdots & 0 \\ \cdots & \cdots & & \cdots \\ 1 & 1 & \cdots & 1 \end{pmatrix} \right)$$

is a $n_c \times k_x k_y k_z n_c$ sparse matrix of the same size as $S^r$, and finding an optimizer $c^r$ that maximizes a correlation between $(S^r)^H \alpha$ and $M^H \alpha$ wherein said optimizer $c^r$ is a column vector of coil sensitivities of a coil at spatial position r in the 3D $c_x \times c_y \times c_z$ image.

According to a another aspect of the invention, there is provided a method for estimating a coil sensitivity map for a magnetic resonance (MR) image, including constructing a matrix $A=\{a_{ij}\}$ from a 3D $c_x \times c_y \times c_z$ image of coil calibration data by gathering sliding blocks of kernel size $k_x \times k_y \times k_z$, wherein A has $[(c_x-k_x+1)\times(c_y-k_y+1)\times(c_z-k_z+1)]$ columns and $k_x k_y k_z n_c$ rows, $n_c$ is a number of coils, and $a_{i,j}$ is a $k_x k_y k_z \times 1$ column vector that represents a jth sliding block of an ith coil, calculating a left singular matrix $V_{\parallel}$ from a singular value decomposition of A, wherein $A=V\Sigma U^H$ and $$V_{\shortparallel} = [v_1, v_2, \ldots, v_\tau] = \begin{pmatrix} v_{1,1} & v_{1,2} & \cdots & v_{1,\tau} \\ v_{2,1} & v_{2,2} & \cdots & v_{2,\tau} \\ \cdots & \cdots & & \cdots \\ v_{n_c,1} & v_{n_c,2} & \cdots & v_{n_c,\tau} \end{pmatrix}$$

is a matrix of left singular vectors of A corresponding to $\tau$ leading singular values wherein $v_{i,k}$ is a $k_x k_y k_z \times 1$ column vector that is an i-th block in vector $v_k$, calculating $$P = V_{\shortparallel} V_{\shortparallel}^H =$$

$$\begin{pmatrix} \begin{pmatrix} p_{1,1,1} & p_{1,1,2} & \cdots & p_{1,1,k_x k_y k_z} \\ p_{1,1,1} & p_{1,2,2} & \cdots & p_{1,2,k_x k_y k_z} \\ \cdots & \cdots & \cdots & \cdots \\ p_{1,n_c,1} & p_{1,n_c,2} & \cdots & p_{1,n_c,k_x k_y k_z} \end{pmatrix} \cdots \begin{pmatrix} p_{n_c,1,1} & \cdots & p_{n_c,1,k_x k_y k_z} \\ p_{n_c,2,1} & \cdots & p_{n_c,2,k_x k_y k_z} \\ \cdots & \cdots & \cdots \\ p_{n_c,n_c,1} & \cdots & p_{n_c,n_c,k_x k_y k_z} \end{pmatrix} \end{pmatrix}$$

wherein $p_{i,j,t}$ is a $k_x k_y k_z \times 1$ column vector, calculating $s_{i,j,t} = F^H(P_t(p_{i,j,t}))$ wherein $F^H$ represents an inverse Fourier transform and $P_t$ represents a zero-padding operator, and solving $M^H c^r = (S^r)^H c^r$ for $c^r$, where $c^r$ is a vector of coil sensitivity maps for all coils at spatial location r, $$S^r = \begin{pmatrix} \begin{pmatrix} s^r_{1,1,1} & s^r_{1,1,2} & \cdots & s^r_{1,1,k_x k_y k_z} \\ s^r_{1,2,1} & s^r_{1,2,2} & & s^r_{1,2,k_x k_y k_z} \\ \cdots & \cdots & \cdots & \cdots \\ s^r_{1,n_c,1} & s^r_{1,n_c,2} & \cdots & s^r_{1,n_c,k_x k_y k_z} \end{pmatrix} \cdots \begin{pmatrix} s^r_{n_c,1,1} & \cdots & s^r_{n_c,1,k_x k_y k_z} \\ s^r_{n_c,2,1} & \cdots & s^r_{n_c,2,k_x k_y k_z} \\ \cdots & \cdots & \cdots \\ s^r_{n_c,n_c,1} & \cdots & s^r_{n_c,n_c,k_x k_y k_z} \end{pmatrix} \end{pmatrix}$$

and $$M = \begin{pmatrix} \begin{pmatrix} 1 & 1 & \cdots & 1 \\ 0 & 0 & \cdots & 0 \\ \cdots & \cdots & & \cdots \\ 0 & 0 & \cdots & 0 \end{pmatrix} \begin{pmatrix} 0 & 0 & \cdots & 0 \\ 1 & 1 & \cdots & 1 \\ \cdots & \cdots & & \cdots \\ 0 & 0 & \cdots & 0 \end{pmatrix} \cdots \begin{pmatrix} 0 & 0 & \cdots & 0 \\ 0 & 0 & \cdots & 0 \\ \cdots & \cdots & & \cdots \\ 1 & 1 & \cdots & 1 \end{pmatrix} \end{pmatrix}.$$

According to a further aspect of the invention, the method includes finding an optimizer $c^r$ that maximizes a correlation between $(S^r)^H \alpha$ and $M^H \alpha$ wherein said optimizer $c^r$ is vector of coil sensitivity maps for all coils at spatial location r in the 3D $c_x \times c_y \times c_z$ image.

According to a further aspect of the invention, solving $M^H c^r = (S^r)^H c^r$ comprises solving eigenvalue equations $$\frac{M(S^r)^H}{k_x k_y k_z} \beta = \bar{\lambda} \beta,$$

and $(S^r(S^r)^H) \gamma = \tilde{\lambda} \gamma$, wherein $\bar{\lambda}$ and $\tilde{\lambda}$ denote eigenvalues, and $\beta$ and $\gamma$ denote eigenvectors.

According to a further aspect of the invention, the method includes calculating $S^r M^H$ using $$m_{i,j} = \sum_{t=1}^{k_x k_y k_z} s_{i,j,t} = \sum_{t=1}^{k_x k_y k_z} F^H(P_t(p_{i,j,t})) = F^H\left(\sum_{t=1}^{k_x k_y k_z} P_t(p_{i,j,t})\right),$$

wherein $m_{i,j}$ is an $c_x \times c_y \times c_z \times 1$ column vector containing the entries of $m_{i,j}^r$ at all spatial locations, and $m_{i,j}^r$ is the i,j elements of the 3D MR image at spatial location r.

According to a further aspect of the invention, the method includes calculating $S^r(S^r)^H$ as $S^r(S^r)^H = k_x k_y k_z Z^r(Z^r)^H$, wherein $$Z^r = \begin{pmatrix} z^r_{1,1} & z^r_{1,2} & & z^r_{1,\tau} \\ z^r_{2,1} & z^r_{2,2} & & z^r_{2,\tau} \\ & & & \\ z^r_{n_c,1} & z^r_{n_c,2} & & z^r_{n_c,\tau} \end{pmatrix}$$

is an $n_c \times \tau$ matrix with the j-row and k-th column being $z_{j,k}^r$, $z_{j,k}^r$ denotes the r-th entry of $z_{j,k} = F^H(P_c(v_{j,k}))$, and $P_c$ denotes the zero-padding operator that maps a center of $V_{j,k}$ to a center of $z_{j,k}$.

According to a further aspect of the invention, the method includes computing the i-th row and j-th column of $Z^r(Z^r)^H$ as $$\sum_{k=1}^{\tau} z^r_{i,k} \overline{z^r_{i,k}}$$

wherein $z_{i,k}^r$ denotes the i-th row and k-th column in $Z^r$.

According to a further aspect of the invention, the coil calibration data is acquired from a center square of frequency space data.

According to another aspect of the invention, there is provided a non-transitory program storage device readable by a computer, tangibly embodying a program of instructions executed by the computer to perform the method steps for estimating a coil sensitivity map for a magnetic resonance (MR) image.

BRIEF DESCRIPTION OF THE DRAWINGS

FIG. 1 is a table summarizing the notation used in this disclosure, according to an embodiment of the invention.

FIG. 2 illustrates zero padding for the case $k_x = k_y = 3$, according to an embodiment of the invention.

FIG. 3 illustrates an eigenvector approach where each k-space point is represented as a linear combination of the k-space points of all the coils in its neighborhood, according to an embodiment of the invention.

FIG. 9 illustrates a reconstruction of a 2D cardiac image, according to an embodiment of the invention.

FIGS. 10(a)-(b) illustrates a reconstruction of a 3D abdomen image, according to an embodiment of the invention.

DETAILED DESCRIPTION OF EXEMPLARY EMBODIMENTS

Figures 4, 5:
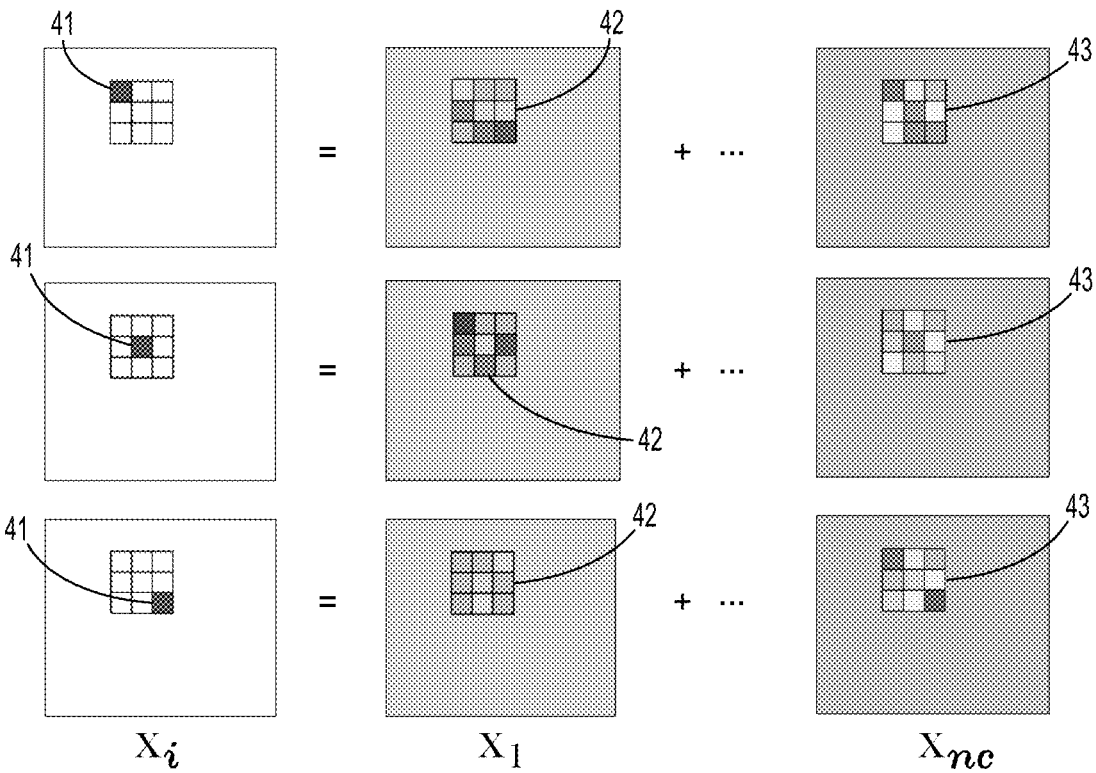
FIG. 4 illustrates the principle of an eigenvector approach of EQ. (13), according to an embodiment of the invention.
FIG. 5 is a table summarizing the value of mean absolute correlation (mac) under different number of kept singular vectors and different kernel sizes, according to an embodiment of the invention.

Exemplary embodiments of the invention as described herein generally include systems and methods for an eigenvector approach to coil sensitivity maps (CSM) estimation for 2-D MR images. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

As used herein, the term "image" refers to multi-dimensional data composed of discrete image elements (e.g., pixels for 2-dimensional images and voxels for 3-dimensional images). The image may be, for example, a medical image of a subject collected by computer tomography, magnetic resonance imaging, ultrasound, or any other medical imaging system known to one of skill in the art. The image may also be provided from non-medical contexts, such as, for example, remote sensing systems, electron microscopy, etc. Although an image can be thought of as a function from $R^3$ to R or $R^7$, the methods of the inventions are not limited to such images, and can be applied to images of any dimension, e.g., a 2-dimensional picture or a 3-dimensional volume. For a 2- or 3-dimensional image, the domain of the image is typically a 2- or 3-dimensional rectangular array, wherein each pixel or voxel can be addressed with reference to a set of 2 or 3 mutually orthogonal axes. The terms "digital" and "digitized" as used herein will refer to images or volumes, as appropriate, in a digital or digitized format acquired via a digital acquisition system or via conversion from an analog image.

Notation:

Throughout this disclosure, scalars are denoted by italic lowercase letters (e.g., $n_c$, $n_x$, $n_y$, $k_x$, $k_y$), vectors by boldface lowercase letters (e.g., $x_i$, $c_i$), and matrices by italic uppercase letters (e.g., $S$ $S^r$). The main notations used in this paper are summarized in Table I, shown in FIG. 1.

Let $\{\}^H$ denote the complex-conjugate transpose operator, $\bar{x}$ denote the complex-conjugate of a scalar x, and $\bar{x}$ be the complex-conjugate of a vector x.

Let i and j denote the indices for the coils in the interval $[1, n_c]$, r denote the spatial location in the 2D image of size $n_x \times n_y$, and t denote the spatial location in the image block of size $k_x \times k_y$.

For an $n_x n_y \times 1$ column vector $x_i$, representing an image by concatenating its columns, $x_i^r$ corresponds to its value at the spatial location r, where r goes from 1 to $n_x n_y$. For a $k_x k_y \times 1$ column vector $v_{i,k}$, representing an image block by concatenating its columns, $v_{i,k}^t$ denotes its value at the spatial location t, where t goes from 1 to $k_x k_y$.

Let $y = P_t(x)$ denote the zero padding operator defined as follows. The input x, a column vector of size $k_x k_y \times 1$, represents a $k_x \times k_y$ image block by concatenating its columns; t, a scalar in the interval $[1, k_x k_y]$, determines which value in x to be put at the center of the matrix of size $n_x \times n_y$; the output y is an $n_x n_y \times 1$ column vector representing an $n_x \times n_y$ matrix, and its non-zero entries are the values of x. In particular, we let $y = P_c(x)$ denote the zero padding operator that put the center point of x to the center location of y. For an image of size $n_x \times n_y$, define the index of its center location as $$\left\lceil \frac{n_x+1}{2} \right\rceil + \left( \left\lceil \frac{n_y+1}{2} \right\rceil - 1 \right) n_x;$$

and for an image block of size $k_x \times k_y$, define the index of its center location as $$\left\lceil \frac{k_x+1}{2} \right\rceil + \left( \left\lceil \frac{k_y+1}{2} \right\rceil - 1 \right) k_x.$$

Embodiments of the present disclosure assume that $n_x$ and $n_y$ are even; but $k_x$ and $k_y$ can be either even or odd.

FIG. 2 illustrates zero padding for the case $k_x = k_y = 3$. The nine squares correspond to the input x, the square 21 is placed at the center of the $n_x \times n_y$ image, t in $\mathscr{T}$ determines which value in x to be put at the center of the 2D image; the remaining entries are filled with zero except for the nine squares; and the three rectangles 22, 23, 24 denote the outputs of $P_1$, $P_5$, and $P_9$, respectively.

Eigenvector Approach

One eigenvector approach is illustrated in FIG. 3, where each k-space point is represented as a linear combination of the k-space points of all the coils in its neighborhood. Let $x_i^r$ denote the value of $x_i$ at the spatial location r. Let $w_{i,j}$ be the convolution kernel for representing the k-space point of the i-th coil by the j-th coil. Mathematically, $x_i^r$ is estimated as:

$$x_i^r = \sum_{j=1}^{n_c} w_{i,j} * x_j, \forall r, \tag{1}$$

where * denotes the convolution operator. Define $$q_{i,j} = F^H(P_C(w_{i,j})). \tag{2}$$

$q_{i,j}$ is the result of applying an inverse Fourier transformation to the convolution kernel $w_{i,j}$ with zero padding, illustrated in FIG. 2. Applying the inverse Fourier transform to both sides of the equation in FIG. 3, one has $$F^H(x_i) = \sum_{j=1}^{n_c} q_{ij} \otimes F^H(x_j) \tag{3}$$

where the convolution theorem has been applied. $F^H(x_i) = m \otimes c_i$ can be inserted into EQ. (3) to obtain $$c_i = \sum_{j=1}^{n_c} q_{i,j} \otimes c_j, \, i = 1, 2, \ldots, n_c. \quad (4)$$

EQ. (4) indicates that all the entries in this equation can be decoupled with respect to the spatial location. Let $c_i^r$, $q_{i,j}^r$ and $c_j^r$ denote the entries of $c_i$, $q_{i,j}$, and $c_j$ at the spatial location r, respectively. EQ. (4) can be rewritten as $$c_i^r = \sum_{j=1}^{n_c} q_{i,j}^r c_j^r, \, i = 1, 2, \ldots, n_c, \, \forall \, r. \quad (5)$$

Denote $Q^r$ as a matrix with the value at the i-row and the j-th column being $q_{i,j}^r$. Let $c^r$ be an $n_c \times 1$ column vector composed of $c_i$'s at the spatial location r. EQ. (5) can be rewritten as the following compact matrix format:

$$c^r = Q^r c^r, \forall r \quad (6)$$

FIG. 3 illustrates the principle of CSM: the three rectangles denote the k-space data of the i-th coil, the first coil, and the last coil, respectively; $x_i^r$ the square 31 in the left plot, is estimated as the linear combination of the k-space points of all the coils in its neighborhood of size $k_x \times k_y$ (here $k_x = k_y = 3$); the nine small squares 32 in $X_1$ and 33 in $X_{n_c}$ correspond to the values in the convolution kernel $w_{i,1}$ and $W_{i,n_c}$.

In an eigenvector approach according to an embodiment of the invention, sliding blocks of size $k_x \times k_y$) are gathered from the calibration data to form a matrix:

$$A = \begin{pmatrix} a_{1,1} & a_{1,2} & \ldots & a_{1,n_b} \\ a_{2,1} & a_{2,2} & \ldots & a_{2,n_b} \\ \ldots & \ldots & & \ldots \\ a_{n_c,1} & a_{n_c,2} & \ldots & a_{n_c,n_b} \end{pmatrix} \quad (7)$$

where $n_b$ denotes the number of sliding blocks extracted from the calibration data, and $a_{i,k}$, which is a $k_x k_y \times 1$ column vector, denotes the k-th sliding block of the i-th coil.

Let $$A = V \Sigma U^H \quad (8)$$

be the Singular Value Decomposition of A. Denote $$V_\| = [v_1, v_2, \ldots, v_\tau] = \begin{pmatrix} v_{1,1} & v_{1,2} & \ldots & v_{1,\tau} \\ v_{2,1} & v_{2,2} & \ldots & v_{2,\tau} \\ \ldots & \ldots & & \ldots \\ v_{n_c,1} & v_{n_c,2} & \ldots & v_{n_c,\tau} \end{pmatrix} \quad (9)$$

as a matrix composed of the left singular vectors of A corresponding to the leading $\tau$ singular values. Here, $v_{i,k}$, a $k_x k_y \times 1$ column vector, is the i-th block in the vector $v_k$. It can be observed from EQS. (7) and (9) that, A and $V_\|$ share a similar structure in that: (1) the block $a_{i,k}$ and $v_{i,k}$ have the same size ($k_x k_y \times 1$); and (2) the number of such blocks for each column is same.

Let $P = V_\| V_\|^H$ and denote $$P = \begin{pmatrix} \begin{pmatrix} p_{1,1,1} & p_{1,1,2} & \ldots & p_{1,1,k_x k_y} \\ p_{1,1,1} & p_{1,2,2} & \ldots & p_{1,2,k_x k_y} \\ \ldots & \ldots & \ldots & \ldots \\ p_{1,n_c,1} & p_{1,n_c,2} & \ldots & p_{1,n_c,k_x k_y} \end{pmatrix} \ldots \begin{pmatrix} p_{n_c,1,1} & \ldots & p_{n_c,1,k_x k_y} \\ p_{n_c,2,1} & \ldots & p_{n_c,2,k_x k_y} \\ \ldots & \ldots & \ldots \\ p_{n_c,n_c,1} & \ldots & p_{n_c,n_c,k_x k_y} \end{pmatrix} \end{pmatrix} \quad (10)$$

where $p_{i,j,r}$ is a $k_x k_y \times 1$ column vector. Embodiments have used a similar block representation for P as A and $V_\|$ in that they all have $n_c$ "rows". Note that the right hand side of EQ. (10) also represents $P^H$, as P is Hermitian (i.e., $P = P^H$).

As $V_\|$ and V have orthogonal column vectors, $$V_\| V_\|^H A = V_\| V_\|^H \Sigma U^H = [I|0] \Sigma U^H \approx A, \quad (11)$$

where I denotes an identity matrix. When $\tau$ equals the rank of A, the "$\approx$" becomes "=". EQ. (11) indicates that, each column of A lies in the space spanned by orthogonal projection $V_\| V_\|^H$ when $\tau$ is set to the rank of A.

Next, embodiments generate EQ. (11) for all k-space blocks. Specifically, let $x_{i,r}$ be a $k_x k_y \times 1$ column vector that denotes the k-space block of the i-th coil at the spatial location r. Assuming that the k-space blocks lie in the space spanned by $V_\|$, $$\begin{pmatrix} x_{1,r} \\ x_{2,r} \\ \ldots \\ x_{n_c,r} \end{pmatrix} = V_\| V_\|^H \begin{pmatrix} x_{1,r} \\ x_{2,r} \\ \ldots \\ x_{n_c,r} \end{pmatrix}, \forall r. \quad (12)$$

The case when EQ. (12) holds approximately will be discussed in the next subsection.

Picking a column of P defined in EQ. (10) and making use of $P = P^H = V_\| V_\|^H P$, EQ. (12) yields $$x_{i,r}^t = \sum_{j=1}^{n_c} (p_{i,j,t})^H x_{j,r}, \forall r, \quad (13)$$

where $x_{i,r}^t$ denotes the t-th element in the vector $x_{i,r}$. FIG. 4 illustrates the principle of an eigenvector approach according to an embodiment of the invention of EQ. (13) with $k_x = k_y = 3$: $x_{i,r}^t$ denoted as the square 41 in the left plot, is represented by the summation of the convolutions between the k-space data of the j-th coil with kernels $(p_{i,j,t})^H$ for j=1, 2, ..., $n_c$; the plots in the first, second, and third row correspond to t=1, 5, 9, respectively; and the nine small squares 42 in $X_1$ and 43 in $X_{n_c}$, which denote $(p_{i,j,t})^H$, constitute the convolution kernel. Note that, by moving the sliding block $x_{i,r}$ over all the spatial locations r=1, 2, ..., $n_x n_y$, the left hand side of EQ. (13) covers the k-space data of the i-th coil; and the right hand side of EQ. (13) corresponds to the summation of the convolutions between the k-space data of the j-th coil and the kernel $(p_{i,j,t})^H$ for j= 1, ..., $n_c$.

For a given i and t, applying the inverse Fourier transformation to both sides of EQ. (13) yields $$c_i = \sum_{j=1}^{n_c} \overline{s_{i,j,t}} \otimes c_j, \quad (14)$$

where $i=1, 2, \ldots, n_c$; $t=1, 2, \ldots, k_x k_y$, and $$s_{i,j,t} = F^H(P_t(p_{i,j,t})) \tag{15}$$

is the result of applying the inverse Fourier transform to $p_{i,j,t}$ with proper zero padding, and $\overline{s_{i,j,t}}$ denotes the complex conjugate of $s_{i,j,t}$.

EQ. (14) indicates that the values at different spatial locations can be decoupled. Let $c_i^r$, $s_{i,j,t}^r$ and $c_j^r$ denote the entries of $c_i$, $s_{i,j,t}$, and $c_j$ at the spatial location r, respectively. Embodiments can rewrite EQ. (14) as $$c_i^r = \sum_{j=1}^{n_c} \overline{s_{i,j,t}^r} c_j^r, \tag{16}$$

where $i=1, 2, \ldots, n_c$; $t=1, 2, \ldots, k_x k_y$.

Let $c^r$ be a column vector composed of $c_i$'s at the spatial location r. Then, $$S^r = \tag{17}$$

$$\left( \begin{pmatrix} s^r_{1,1,1} & s^r_{1,1,2} & \cdots & s^r_{1,1,k_xk_y} \\ s^r_{1,2,1} & s^r_{1,2,2} & & s^r_{1,2,k_xk_y} \\ \cdots & \cdots & \cdots & \cdots \\ s^r_{1,n_c,1} & s^r_{1,n_c,2} & \cdots & s^r_{1,n_c,k_xk_y} \end{pmatrix} \cdots \begin{pmatrix} s^r_{n_c,1,1} & \cdots & s^r_{n_c,1,k_xk_y} \\ s^r_{n_c,2,1} & \cdots & s^r_{n_c,2,k_xk_y} \\ \cdots & \cdots & \cdots \\ s^r_{n_c,n_c,1} & \cdots & s^r_{n_c,n_c,k_xk_y} \end{pmatrix} \right)$$

Let $$M = \left( \begin{pmatrix} 1 & 1 & \cdots & 1 \\ 0 & 0 & \cdots & 0 \\ \cdots & \cdots & & \cdots \\ 0 & 0 & \cdots & 0 \end{pmatrix} \begin{pmatrix} 0 & 0 & \cdots & 0 \\ 1 & 1 & \cdots & 1 \\ \cdots & \cdots & & \cdots \\ 0 & 0 & \cdots & 0 \end{pmatrix} \cdots \begin{pmatrix} 0 & 0 & \cdots & 0 \\ 0 & 0 & \cdots & 0 \\ \cdots & \cdots & & \cdots \\ 1 & 1 & \cdots & 1 \end{pmatrix} \right) \tag{18}$$

be a sparse matrix of the same size as $S^r$ (i.e., $n_c \times k_x k_y n_c$). It can be verified that $MM^H = k_x k_y I$, where I denotes an identity matrix. EQ. (16) can be rewritten as $$M^H c^r = (S^r)^H c^r. \tag{19}$$

EQ. (19) indicates that $c^r$ is the eigenvector of a generalized eigenvalue equation $$(S^r)^H \alpha = \lambda M^H \alpha, \tag{20}$$

corresponding to the eigenvalue 1, where $\alpha$ is an $n_c \times 1$ column vector representing the generalized eigenvector and $\lambda$ is a scalar representing the generalized eigenvalue.

Since $S^r$ and M are $n_c \times k_x k_y n_c$ non-square matrices, it is unclear (1) whether there exist a real eigenvalue $\lambda$ and (complex) eigenvector $\alpha$ that satisfy EQS. (19) and (20); and (2) how one can solve EQ. (19) efficiently and robustly. The above situation is further complicated by the fact that EQ. (12) usually only holds approximately as $\tau$ is usually set less than or equal to the rank of A, even for the calibration data. Therefore, the left and right sides of EQS. (13), (14), (16), and (19) may only be approximately equal To deal with the aforementioned issues, embodiments of the invention solve the following two eigenvalue equations:

$$\frac{M(S^r)^H}{k_x k_y} \beta = \bar{\lambda} \beta, \tag{21}$$

$$(S^r(S^r)^H) \gamma = \tilde{\lambda} \gamma, \tag{22}$$

where $\bar{\lambda}$ and $\tilde{\lambda}$ denote the eigenvalues, and $\beta$ and $\gamma$ denote the eigenvectors. Specifically, embodiments of the invention can compute $c^r$ as the eigenvector of EQ. (21) corresponding to the largest eigenvalue. In other words, $c^r$ is the solution to the following equation $$c^r = \underset{\alpha: \|\alpha\|_2 = 1}{\operatorname{argmax}} \langle (S^r)^H \alpha, M^H \alpha \rangle \tag{23}$$

and $c^r$ is the optimizer that maximizes the correlation between $(S^r)^H \alpha$ and $M^H \alpha$, i.e., the correlation between the left and right hand sides of EQ. (19). Embodiments of the invention may refer to this approach as MACO, which stands for maximal correlation. In addition, EQ. (23) also applies to the case in which EQ. (19) holds exactly.

It will now be shown that $M(S^r)^H$ is Hermitian:
Theorem 1:
The matrix $M(S^r)^H$ is Hermitian, i.e., $M(S^r)^H = S^r M^H$. Thus, the eigenvalues of EQ. (21) are all real.

The proof of Theorem 1 is provided in the Appendix, below. The eigen-decomposition of $$\frac{M(S^r)^H}{k_x k_y}$$

has the following features: (1) the matrix is Hermitian, and the existence of real eigenvalues is guaranteed; (2) there exists numerically stable and efficient approaches for the eigenvalue decomposition of a Hermitian matrix; and (3) the size of $M(S^r)^H$, $n_c \times n_c$, is much smaller than $S^r$. In addition, experiments suggest that $M(S^r)^H$ may be positive semi-definite.

Next, the relationships among EQS (20), (21), and (22) will be defined.
Theorem 2:
For any $\lambda$ and $\alpha$ satisfying the generalized eigenvalue equation of EQ. (20), $\lambda$ is real, and $$\frac{M(S^r)^H}{k_x k_y} \alpha = \lambda \alpha, \tag{24}$$

i.e., $\lambda$ and $\alpha$ are also the eigenvalue and eigenvector of EQ, (21), respectively.

The proof of Theorem 2 is given in the Appendix, below. Theorem 2 shows that any $\lambda$ and $\alpha$ that satisfy EQ. (19) can be computed by applying the eigenvalue decomposition to the square Hermitian matrix $$\frac{M(S^r)^H}{k_x k_y}.$$

Theorem 3:
For any $\lambda$ and $\alpha$ satisfying the generalized eigenvalue equation of EQ. (20), then $$\frac{S^r(S^r)^H}{k_x k_y} \alpha = \lambda^2 \alpha, \tag{25}$$

i.e., $\lambda^2$ and $\alpha$ are also the eigenvalue and eigenvector of EQ. (22), respectively. In addition, $\lambda^2$ and $\alpha$ are the eigenvalue and eigenvector of EQ. (25), if and only if $\lambda^2$ and $\alpha$ are the eigenvalue and eigenvector of $$\left(\frac{M(S^r)^H}{k_x k_y}\right)^2 \alpha = \lambda^2 \alpha, \tag{26}$$

The proof of Theorem 3 is given in the Appendix, below. This theorem shows that: (1) if a generalized eigenvalue equation has solutions, it can also be solved by EQ. (22); (2) the eigenvalue decomposition of $$\frac{S^r(S^r)^H}{k_x k_y}$$

has the same eigenvalues and eigenvectors as $$\left(\frac{M(S^r)^H}{k_x k_y}\right)^2;$$

and (3) the eigenvector decomposition of $$\frac{S^r(S^r)^H}{k_x k_y}$$

is also the eigenvector of $$\frac{M(S^r)^H}{k_x k_y},$$

as $$\frac{M(S^r)^H}{k_x k_y}$$

is Hermitian. If the conjecture that $$\frac{M(S^r)^H}{k_x k_y}$$

is positive semidefinite is true, then $$\frac{S^r(S^r)^H}{k_x k_y}$$

has the same eigenvalues as $$\frac{M(S^r)^H}{k_x k_y}.$$

A naive implementation would be to compute $S^r$ for all the spatial locations and then apply eigenvalue decomposition to EQ. (21) to obtain $c^r$. However, the computational cost is $n_c^2 k_x k_y$ 2D Fourier transformations, leading to a computation cost of $O(n_c^2 k_x k_y n_x n_y \log(n_x n_y))$ and a storage cost of $O(n_c^2 k_x k_y n_x n_y)$. This can be too demanding for both computation and storage. For example, when $n_x = n_y = 256$, $k_x = k_y = 6$, and $n_c = 32$, it costs about 10 GB for storage using single precision in Matlab and $O(10^9)$ floating operations for computation. When the size kernel size $k_y \times k_y$ is large, the computational and storage costs are even higher.

To deal with the above issues, a MACO approach according to embodiments of the invention need only to compute $S^r M^H$ or $S^r(S^r)^H$. A useful operation for efficiently computing $S^r M^H$ is $$m_{i,j}^r = \sum_{t=1}^{k_x k_y} s_{i,j,t}^r, \tag{27}$$

$\forall r,$ where $m_{i,j}^r$ is the i,j elements of the 2D MR image at spatial location r, which can be rewritten as $$m_{i,j} = \sum_{t=1}^{k_x k_y} s_{i,j,t}, \tag{28}$$

where $m_{i,j}$ is an $n_x n_y \times 1$ column vector containing the entries of $m_{i,j}^r$ at all spatial locations. Incorporating EQ. (15):

$$m_{i,j} = \sum_{t=1}^{k_x k_y} F^H(P_t(p_{i,j,t})) = F^H\left(\sum_{t=1}^{k_x k_y} P_t(p_{i,j,t})\right), \tag{29}$$

which shows that only one Fourier transformation is needed to obtain $m_{i,j}$. As i and j goes from 1 to $n_c$ and $S^r M^H$ is Hermitian, $$\frac{n_c(n_c + 1)}{2}$$

Fourier transformation are needed. With $m_{i,j}$, it can be shown that the i-th row and j-th column of the matrix $S^r M^H$ is $m_{i,j}^r$. The computation cost is $O(n_c^2 n_x n_y \log(n_x n_y))$, and the memory cost is $O(n_c^2 n_x n_y)$.

When $\tau$ is small, EQ (22) can be more efficiently computed than EQ. (21). Let $$z_{j,k} = F^H(P_c(v_{j,k})) \tag{30}$$

and $z_{j,k}^r$ denotes the r-th entry of $z_{j,k}$. Let $Z^r$ be an $n_c \times \tau$ matrix with the j-row and k-th column being $z_{j,k}^r$, i.e., $$Z^r = \begin{pmatrix} Z_{1,1}^r & Z_{1,2}^r & & Z_{1,\tau}^r \\ Z_{2,1}^r & Z_{2,2}^r & & Z_{2,\tau}^r \\ & & & \\ Z_{n_c,1}^r & Z_{n_c,2}^r & & Z_{n_c,\tau}^r \end{pmatrix} \tag{31}$$

Theorem 4: $S^r(S^r)^H$ can be computed as:

$$S^r(S^r)^H = k_x k_y Z^r (Z^r)^H \qquad (32)$$

The proof of Theorem 4 can be found in the Appendix, below.

By transforming the computation of $S^r(S^r)^H$ to $Z^r(Z^r)^H$ in EQ. (32), the number of 2-D Fourier transforms can be reduced from $n_c^2 k_x k_y$, $n_c \tau$. As $\tau$ is typically far less than $n_c k_x k_y$, this can save the computation cost. In addition, the storage cost can be reduced from $O(n_c^2 k_x k_y n_x n_y)$ to $O(n_c^2 k_k k_y)$, when $Z^r(Z^r)^H$ is implemented as follows. An implementation according to an embodiment of the invention is based on the observation that the i-th row and j-th column of $Z^r(Z^r)^H$ can be computed as $$\sum_{k=1}^{\tau} z^r_{i,k} \overline{z^r_{j,k}} \qquad (33)$$

where $z_{i,k}^r$ denotes the i-th row and k-th column in $Z^r$. This shows that, instead of pre-computing $Z^r$, embodiments of the invention can compute one column of $Z^r$ each time.

Table II, shown in FIG. 5, summarizes the computation cost for computing $S^r$, $M(S^r)^H$, and $S^r(S^r)^H$. It can be seen that the computational and storage costs of computing $M(S^r)^H$ and $S^r(S^r)^H$ are much slower than for $S^r$. In addition, when $$\tau < \frac{n_c + 1}{2},$$

the computation cost of $S^r(S^r)^H$ is lower than $M(S^r)^H$.

Figure 6:
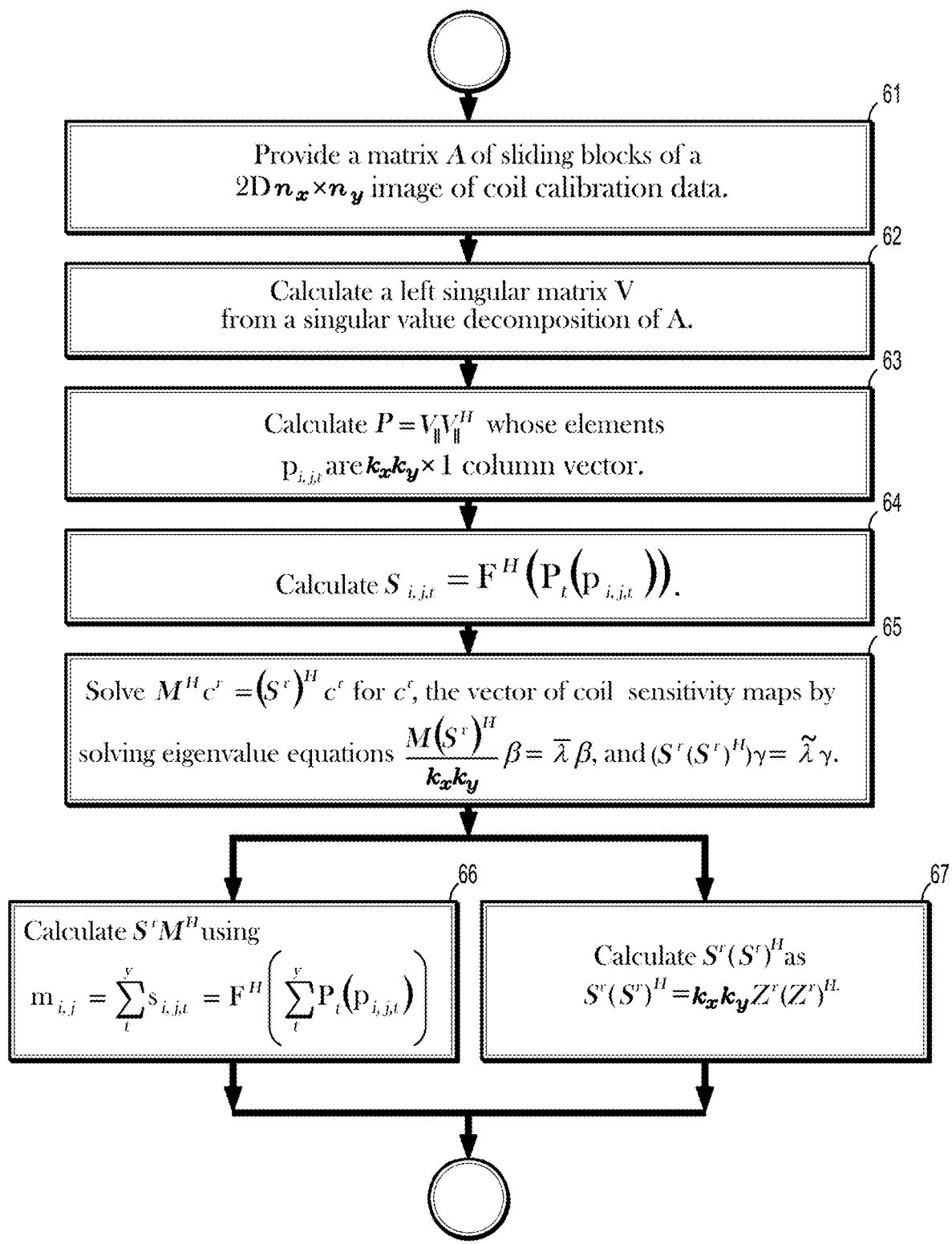
FIG. 6 is a flowchart of an eigenvector approach to estimating coil sensitivity maps, according to an embodiment of the invention.

FIG. 6 is a flowchart of an eigenvector approach to estimating coil sensitivity maps, according to an embodiment of the invention. Referring now to the figure, an eigenvector approach begins at step 61 by providing the matrix A of sliding blocks of a 2D $n_x n_y$ image of coil calibration data as defined in EQ. 7. At step 62, the left singular matrix $V_\parallel$ of EQ. (9) is calculated from the singular value decomposition of A of EQ. (8), and matrix P is calculated at step 63 from $V_\parallel$ using $P = V_\parallel V_\parallel^H$. At step 64, the elements $S_{i,j,t}^r$ of matrix $S^r$ are calculated by applying an inverse Fourier transform to a zero-padded P, and at step 65, the eigenvalue equation $M^H c^r = (S^r)^H c^r$ of EQ. (19) is solved using the eigenvalue systems of EQS. (21) and (22). The system of EQ. (21) can be solved using EQS. (27), (28), and (29) at step 66, and the system of EQ. (22) can be solved using EQ. (32), at step 67.

Figure 7:
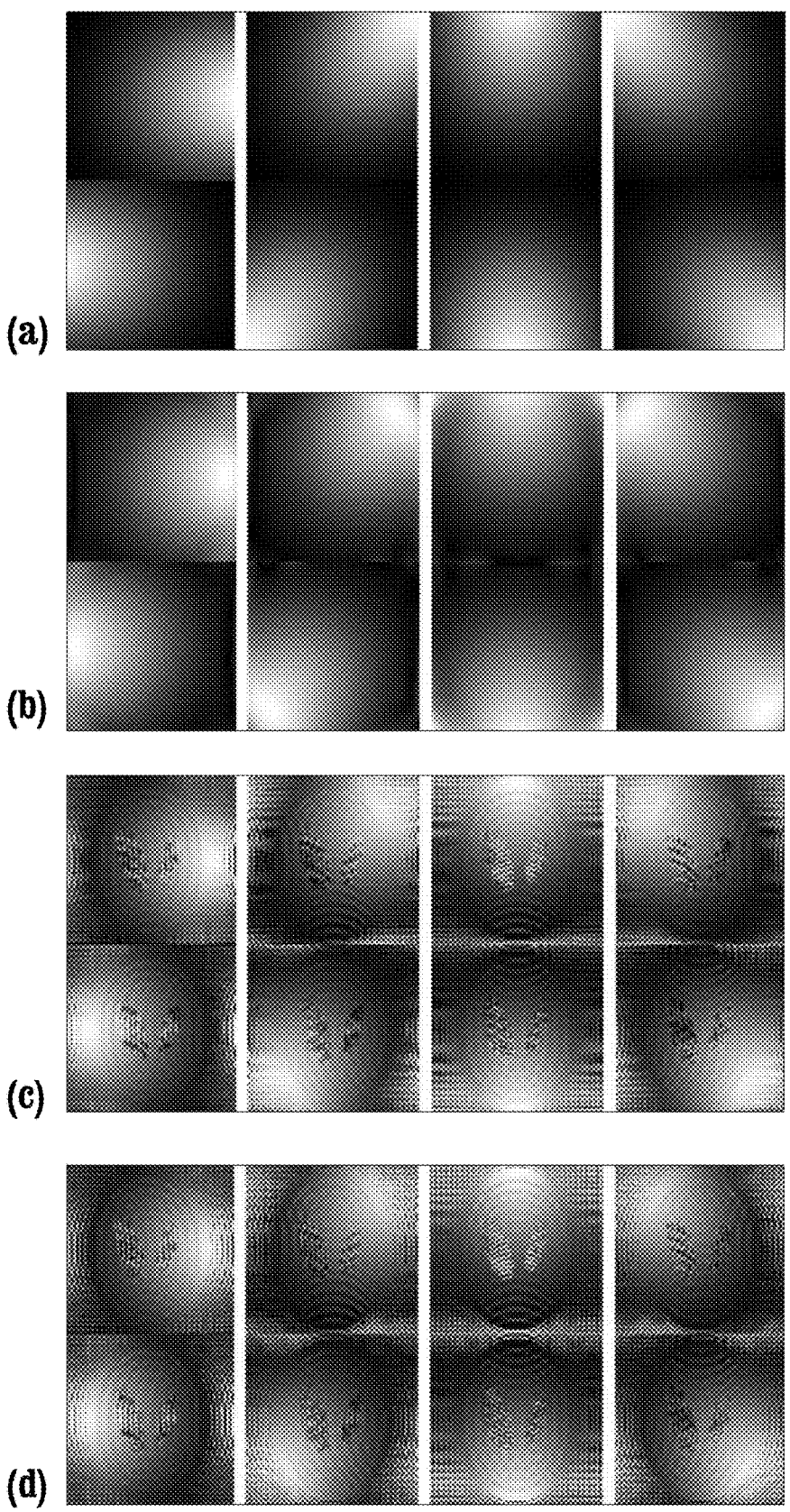
FIGS. 7(a)-(d) depict CSM's obtained by various approaches, according to an embodiment of the invention.

Experiments
Simulation:

Experiments were performed on a simulated phantom. A 2D brain phantom and coil sensitivity maps of eight coil channels, were generated using publicly available codes, and the size of the brain phantom is set to $n_x = n_y = 256$. The simulated eight coil sensitivity maps are shown in FIG. 7(a). With the simulated brain phantom and the simulated sensitivity maps, k-space data was generated for the eight coils. To estimate the coil sensitivity maps, the center 32×32 k-space data was used as the calibration data. The estimated CSM's of a MACO approach according to an embodiment of the invention are shown in FIG. 7(b), where the kernel size is set to $k_x = k_y = 6$ and $\tau = 55$. For comparison, FIG. 7(c) depicts CSM's estimated by the B1-Map approach with spatial scaling, and FIG. 7(d) depicts CSM's obtained by dividing the low resolution coil images by the sum-square images. It can be observed that, a MACO approach according to an embodiment of the invention generates CSM's that are very close to the ground truth. Further, the estimated sensitivity maps in FIG. 7(d) in fact correspond to: (1) those estimated by the B1-Map approach if the spatial smoothing is not applied; and (2) those estimated by a MACO approach according to an embodiment of the invention when the calibration kernel size is set to the size of the calibration data.

Next, CSM's estimated by a MACO approach according to an embodiment of the invention were quantitatively compared with the ground truth and the B1-Map approach. Let $c_*^r$ be the ground truth coil sensitivities for all the coils at the spatial location r, assuming that $c_*^r$ has a unique length, i.e., $\|c_*^r\|=1$. Note that, in both a MACO approach according to an embodiment of the invention and a B1-Map, if $c^r$ is the obtained eigenvector, then $\eta c^r$ is also a valid eigenvector for the corresponding eigenvalue if $\eta$ is a complex scalar with unit length (i.e., $|\eta|=1$). The similarity between the estimated $c^r$ and the ground truth $c_*^r$ was measured using the absolute correlation defined as:

$$\rho(c^r, c_*^r) = |\langle c_*^r, c^r \rangle|, \qquad (34)$$

As $\|c_*^r\| = \|c^r\| = 1$, if $\rho(c^r, c_*^r) = 1$, then $c^r = \eta c_*^r$, where $\eta$ is a complex scalar with unit length. It is clear that $0 \le \rho(c^r, c_*^r) \le 1$, and the larger the absolute correlation is, the closer is the estimated $c^r$ to the ground truth. With the absolute correlation, the goodness of $c^r$ $r = 1, 2, \ldots, n_x n_y$, can be measured using the mean absolute correlation (mac) defined as $$mac = \sum_{r=1}^{n_x n_y} \frac{\rho(c^r, c_*^r)}{n_x n_y}. \qquad (35)$$

Figure 8:
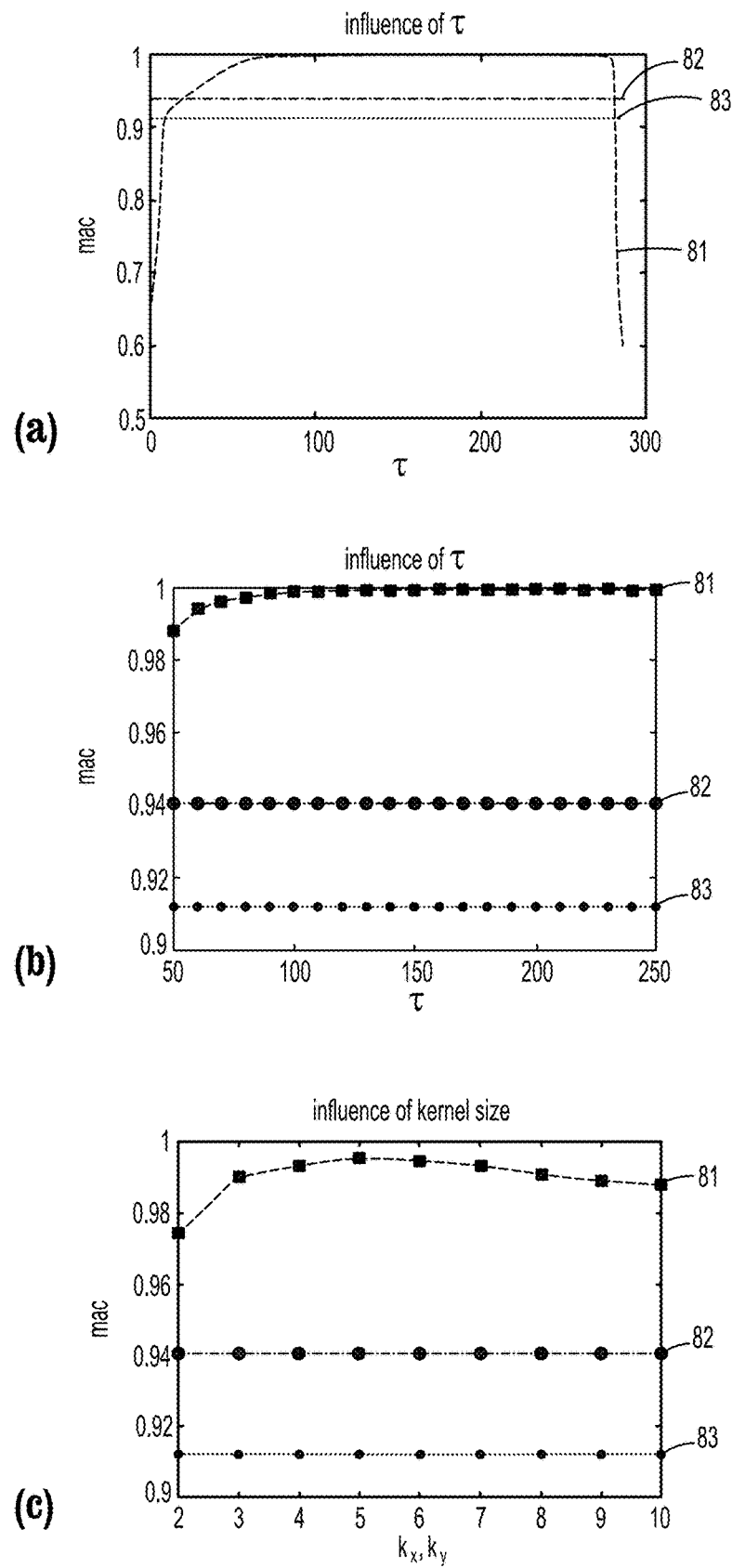
FIGS. 8(a)-(c) are graphs of the mean absolute correlation as a function of different number of kept vectors and different kernel sizes, according to an embodiment of the invention.

The kernel size is set to $k_x = k_y = 6$ and the values of the mean absolute correlation (mac) were explored using different numbers of kept singular vectors, with the results shown in FIGS. 8(a)-(b). In each of FIGS. 8(a), (b), and (c), plot 81 represents mac values as calculated using a MACO approach according to an embodiment of the invention, plot 82 represents mac values as calculated using a B1-Map, and plot 83 represents mac values as calculated by dividing the low resolution coil image by the sum-of-square image. Since A in EQ. (7) is a 288×729 matrix, $\tau$ can be selected in the interval [1, 288]. As can be observed from FIG. 8(a), the value of mac is low, when $\tau$ is either very small or very large. This is reasonable, because on one hand, when $\tau$ is very small, $V_\parallel$ cannot capture the full range space of the sliding blocks, and thus the left and right hand sides of EQ. (9) do not match well. On the other hand, when $\tau$ is very large, $P = V_\parallel V_\parallel^H$ defined in EQ. (10) tends to an identity matrix, and in this case, the left and right hand sides of EQ. (9) match very well. However, a near identity matrix for P gives too much freedom to the sliding blocks in EQ. (12), and thus P contains less information about the calibration data. In the extreme case, when P is an identity matrix, EQ. (12) always holds and it does not have any information about the calibration data. Nevertheless, FIGS. 8(a)-(b) indicate that one can find a large range of is s with which a MACO approach according to an embodiment of the invention yields larger values of mac than both the B1-Map approach and the approach which divides the low resolution coil image by the sum-of-square image. The optimal value of $\tau$ may be related to the noise in the calibration data (note that, for the simulated phantom, no noise is added). Experiments on dozens of data sets show that setting $\tau$ as the smallest value such that $\Sigma_{k=1}^{\tau} \sigma_k / \Sigma_{k=1}^{288} \sigma_k \geq 0.95$ works well, where $\sigma_k$ is the k-th largest singular vector of A in EQ. (7).

In addition, the performance of a MACO approach according to an embodiment of the invention was tested under varying kernel sizes, and the results are depicted in FIG. 8(c). As can be observed from the figure, the kernel size can change from 2×2 to 10×10 with $k_x=k_y$. The value of $\tau$ was set to the smallest value for which $\Sigma_{k=1}^{\tau} \sigma_k / \Sigma_{k=1}^{288} \sigma_k \geq 0.95$. The results again show that a MACO approach according to an embodiment of the invention can achieve a higher mac than the B1-Map. The optimal kernel size may depend on the size of the calibration data, the size of the image, and the noise contained in the calibration data.

Reconstruction

For MR reconstruction, the following formulation was used:

$$\min_{m} \frac{1}{2} \sum_{i=1}^{n_c} \|F_u(c_i \otimes m) - yi\|_2^2 + \lambda \|Wm\|_1, \quad (36)$$

where $F_u$ is an under-sampling Fourier transformation operator, $c_i$ denotes the coil sensitivity map for the i-th coil, m denotes the image to be reconstructed, $y_i$ is the observed undersampled k-space data for the i-th coil, and W is a redundant Haar wavelet transformation.

Reconstruction of Two-Dimensional Cardiac Image:

Data was acquired from a healthy volunteer on a 1.5T clinical MR scanner. The imaging parameters include: field of view=313×370 mm², matrix size=176×208, and 20 coils.

FIG. 9 illustrates the reconstruction of a 2D Cardiac Image. Images in the first row are the coil sensitivity maps estimated by a MACO approach according to an embodiment of the invention for coils 1, 10, and 20, respectively; images in the second row are the coil sensitivity maps estimated by the B1-Map for coils 1, 10, and 20, respectively; the first image in the last row illustrates incoherent Cartesian sampling of the k-space; the second image and the third image in the last row correspond to the reconstructions with the CSM's estimated a MACO approach according to an embodiment of the invention and the B1-Map, respectively.

The first two rows of FIG. 9 depicts the estimated coil sensitivity maps by a MACO approach according to an embodiment of the invention and B1-Map with the center 24 lines as calibration data. It can be seen that the CSMs estimated by a MACO approach according to an embodiment of the invention, shown in the first row, are smoother than the B1-Map, shown in the second row. The first image in the last row illustrates the incoherent Cartesian sampling pattern for generating the under-sampled k-space data. Such incoherent sampling leads to an acceleration factor of 6.3. Images obtained by solving EQ. (36) with CSM's estimated by a MACO approach according to an embodiment of the invention, the second image in the last row, are smoother than those estimated by the B1-Map, shown in the third image in the last row. The CSM estimated by the B1-Map leads to several artifacts, while the image reconstructed with the CSM's estimated by a MACO approach according to an embodiment of the invention contains fewer artifacts due to a more accurate estimation of the sensitivity maps.

Reconstruction of Three-Dimensional Abdomen Image:

Data was acquired from a healthy volunteer on a 1.5T clinical MR scanner. Imaging parameters include: field of view=380×320 mm², matrix size=320×270, 72 partitions, and 24 coils. A Partial Fourier transform is used in the acquisition of the k-space data, and the sampling pattern in the phase encoding partition plane is shown in FIG. 10(a). Such sampling pattern leads to an acceleration factor of 9. An inverse Fourier transformation is applied to decouple the samples in the readout direction, and the CSM's are estimated and reconstructed for each decoupled slice along this direction. Specifically, the CSM's for each slice are estimated from the center calibration data of size 24×24. Images in the first and second rows of FIG. 10(b) show the coil sensitivity maps estimated by a MACO approach according to an embodiment of the invention and the B1-Map for one partition, and the reconstructed images for the same partition are shown in the last row of FIG. 10(b). Note that: (1) the CSM's obtained by a MACO approach according to an embodiment of the invention are smoother than those by obtained from a B1-Map; (2) some infolding artifacts are observed in the image reconstructed with the CSM's estimated by the B1-Map; and (3) the CSM's estimated by a MACO approach according to an embodiment of the invention have fewer artifacts.

Like the B1-Map approach, if $c^r$ is the obtained eigenvector by a MACO approach according to an embodiment of the invention, then $\eta c^r$ is also a valid eigenvector for the corresponding eigenvalue if $\eta$ is a complex scalar with unit length, i.e., $|\eta|=1$. This indicates that a MACO approach according to an embodiment of the invention may not be able to recover the phase of the reconstructed image. According to embodiments of the invention, coil sensitivity maps were normalized to the first coil, and thus the phase of the reconstructed image is relative to the first coil. This may not be an issue when the magnitude of the reconstructed image is the focus.

Influence of the Amount of Calibration Data on the Estimated CSM Quality

Figure 11:
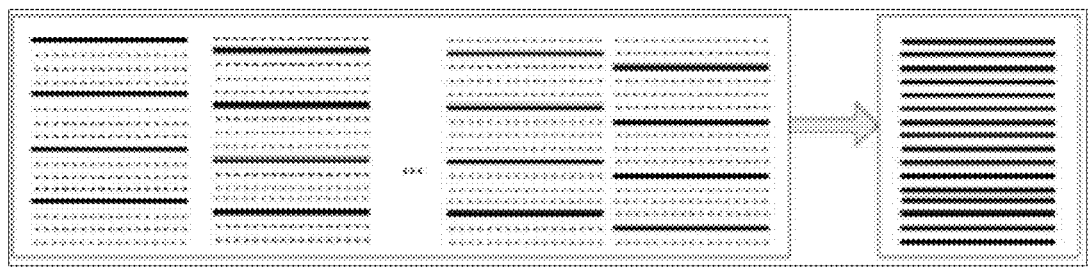
FIG. 11 illustrates a typical Cartesian sampling pattern used in dynamic cardiac MR imaging, according to an embodiment of the invention.

In dynamic cardiac MR imaging, the k-space data can be acquired in an interleaving way, as illustrated in the left plot of FIG. 11, which illustrates a typical Cartesian sampling pattern used in dynamic cardiac MR imaging. In the figure, solid lines represent acquired data, and dashed lines represent missing data. The average k-space data over time, shown in the right plot of FIG. 11, can be used for calibration purpose. One might think that using more the calibration data will improve the quality of the estimated CSM. However, in real applications, the data are usually accompanied by noise. More importantly, the boundary high frequency data might be more sensitive to noise than the center low frequency data, as the high frequencies are typically much weaker in strength than the low frequencies, leading to less robustness when the same noise is added. Therefore, one could conjecture that "the center square calibration data could perform better than the center rectangular calibration data for coil sensitivity maps estimation".

Figure 12:
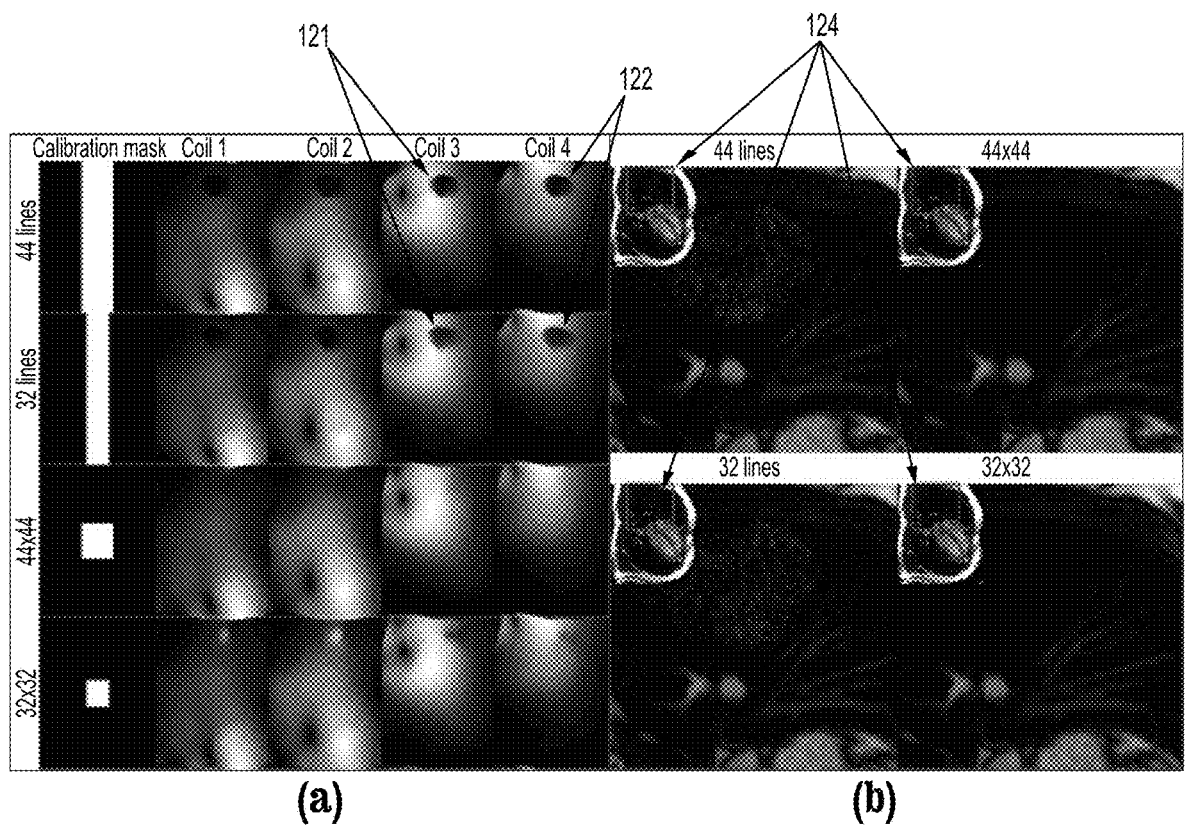
FIGS. 12(a)-(b) illustrate the influence of the amount of used calibration data on the reconstruction, according to an embodiment of the invention.

Experiments were conducted using k-space data acquired on a 1.5T clinical MR scanner. The acquired k-space data was subsampled to generate the following under-sampled k-space data: 24 temporal phases each containing 18 frequency encodings, 30 coils, and image size=192×164. FIGS. 12(a)-(b) illustrate the influence of the amount of used calibration data on the reconstruction. FIG. 12(a) depicts the mask for generating the calibration k-space data and the estimated coil sensitivity maps, where white denotes that the corresponding average k-space data are used for calibration, and FIG. 12(b) depicts the reconstruction images. FIG. 12(a) illustrates four coil sensitivity maps estimated by an eigenvector approach according to an embodiment of the invention, using (1) the center rectangular 44 lines (top row), (2) the center rectangular 32 lines ($2^{nd}$ row), (3) the center 44×44 square block ($3^{rd}$ row), and (4) the center 32×32 square block (bottom row). It can be seen that, compared with the more rectangular calibration data, the square center calibration data can achieve a smoother CSM. For example, the black holes 121, 122 in coil 3 and coil 4 are observed when using center rectangular calibration data, but not when using center square calibration data. FIG. 12(*b*) compares the reconstruction results achieved by a reconstruction approach according to an embodiment of the invention. In FIG. 12(*b*), the boxed regions 124 at the upper left are zoomed out and displayed in the rest of each image. The noise observed using a CSM with rectangular calibration data disappears when using the square calibration data.

Figure 13:
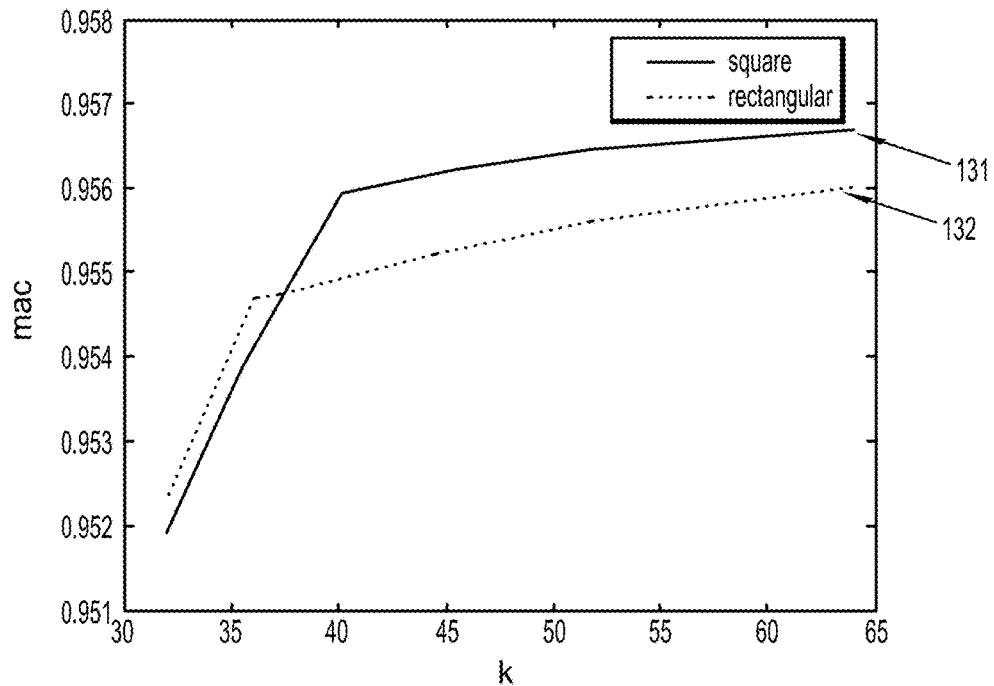
FIG. 13 compares the square and the rectangular calibration data in terms of the mac criterion, according to an embodiment of the invention.

In addition, experiments were conducted on synthetic static 2D data as follows. A phantom of size 256×256 was generated, and then κ coil sensitivity maps were synthesized from which the k-space data was generated. The CSM was estimated by using (1) the center $k_x k_y$ square data, and (2) the center rectangular k lines, where k ranges from 32 to 64. The mac (maximum correlation) criterion defined above was computed. The value of mac is between 0 and 1, and a larger mac value means that the estimated coil profile is closer to the simulated ground truth. FIG. 13 compares the square calibration data 131 and the rectangular calibration data 132 in terms of the mac criterion, from which can be seen a clear advantage of the square calibration data. The underlying reason might be that the center low frequency data are less sensitive to the noise than the boundary high frequency data due to the larger intensities.

Extension to 3-Dimensions

When the data is acquired using 3D Cartesian sampling, one way for estimating the coil profiles is to decouple the data along the frequency-encoding direction and then perform the estimation in a 2D manner. Then, the 3D coil profiles can be obtained by stacking the estimated 2D coil profiles. The independent estimation of the coil profiles for each slice causes discontinuity in the profile along the frequency encoding direction. This discontinuity can be propagated into the reconstruction, causing artifacts. In addition, applying a 2D eigen-vector approach ignores the correlation between the calibration data in the frequency encoding direction and downgrades the effect of rank reduction in the eigen-vector approach achieved by singular value decomposition.

Figure 14:
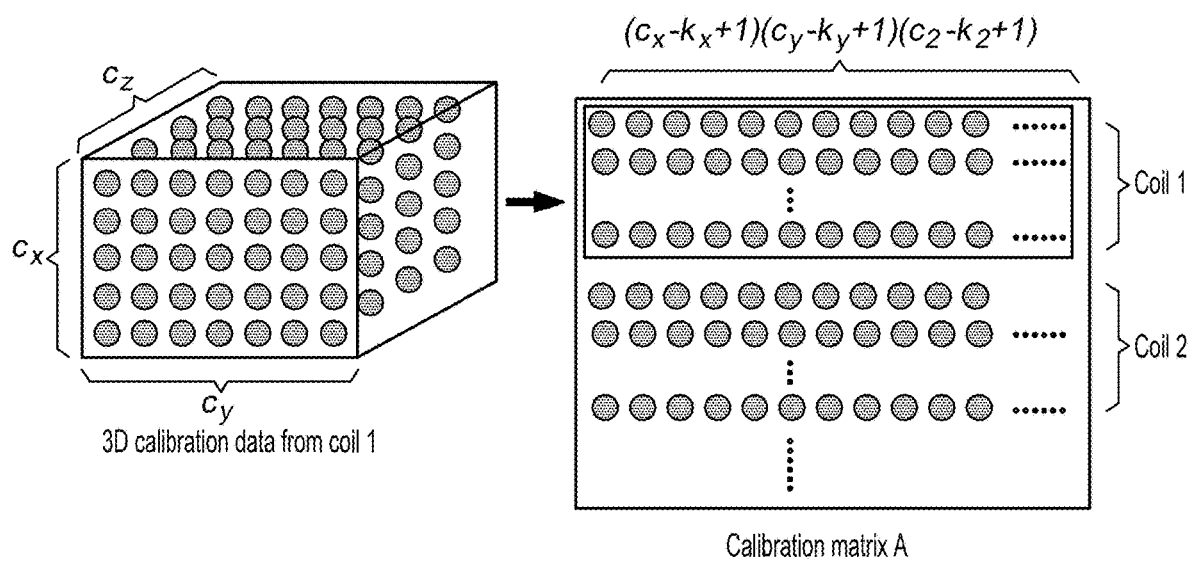
FIG. 14 illustrates the conversion of the calibration data into a calibration matrix for 3D CSM estimation, according to an embodiment of the invention.

A 3D eigen-vector approach according to an embodiment of the invention utilizes all the calibration data together and estimates the coil profiles from different slices simultaneously. FIG. 14 illustrates the conversion of the calibration data into a calibration matrix for 3D CSM estimation, according to an embodiment of the invention. As shown in FIG. 14, the calibration matrix A is constructed from calibration data of size $c_x \times c_y \times c_z$ by gathering sliding blocks of kernel size $k_x \times k_y \times k_z$. The number of columns in A is $[(c_x-k_x+1)\times(c_y-k_y+1)\times(c_z-k_z+1)]$, and the number of rows of A is $k_x k_y k_z n_c$, where $n_c$ is the number of coils. A low rank subspace of A can be computed by singular value decomposition $A=V\Sigma U^H$, and setting $V_\parallel$ to the left singular vectors of A corresponding to the leading τ singular values. Let $S^c$ be the coil sensitivity at coil $c \in [1, 2, \ldots, c]$, which are computed following an eigenvector approach according to an embodiment of the invention as discussed above, i.e., set to the eigenvectors corresponding to the largest eigenvalues.

Figure 15:
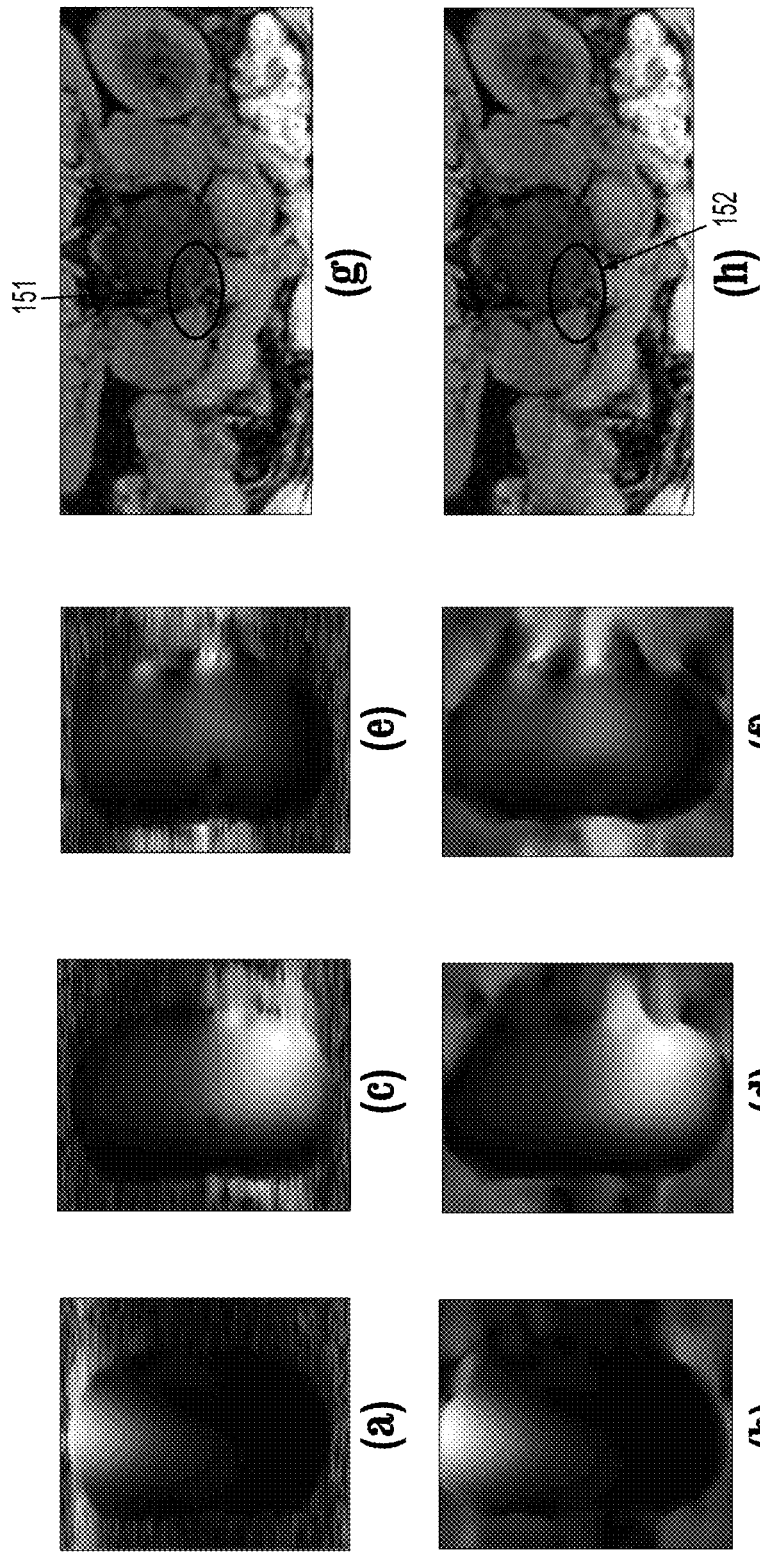
FIGS. 15(a)-(h) illustrate a comparison of a 2D eigenvector approach and a 3D eigenvector approach according to an embodiment of the invention.

A 3D CSM estimation method according to an embodiment of the invention was compared with a 2D method using 3D data. The data were acquired from a healthy volunteer on a 1.5T clinical MR scanner. The imaging parameters include a field of view of 320×260×96 $mm^2$, and 26 coils. In the phase encoding-partition plane, a total of 2370 (out of 24960) points were acquired, and the central 24×24 block was treated as calibration data. FIGS. 15(*a*)-(*h*) illustrate a comparison of a 2D eigenvector approach and a 3D eigenvector approach according to an embodiment of the invention. FIGS. 15(*a*), (*c*), and (*e*) depict coil profiles of coils nos. 1, 5 and 10 using a 2D eigenvector approach, and FIGS. 15(*b*), (*d*), and (*f*) depict coil profiles of coils nos. 1, 5 and 10 using a 3D eigenvector approach according to an embodiment of the invention. As shown in FIGS. 15(*a*)-(*f*), the vertical direction is the frequency encoding direction. The coil profiles from the 3D method are smoother than the ones from the 2D method, especially along the frequency encoding direction. FIGS. 15(*g*)-(*h*) compare the central region of the reconstructed image at slice 72 along the transversal axis, using a 2D eigenvector approach for FIG. 15(*g*) and a 3D eigenvector approach for FIG. 15(*h*). The overall image using coil profiles from a 3D method according to an embodiment of the invention is smoother than the image from the 2D method. The artifact marked by the circle 152 in FIG. 15(*h*) is less obvious than the circle 151 in the image of FIG. 15(*g*).

Reconstruction with the coil profile from a 3D method according to an embodiment of the invention substantially eliminates artifacts caused by discontinuities along the frequency encoding direction from the 2D method. The overall image noise is lower in a 3D method according to an embodiment of the invention due to a smoother coil profile. Efficient computation of a 3D eigenvector method according to an embodiment of the invention can be achieved by utilizing methods according to embodiments of the invention disclosed above, which has a storage cost of $O(k_x n_y n_c^2)$.

System Implementations

It is to be understood that embodiments of the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

Figure 16:
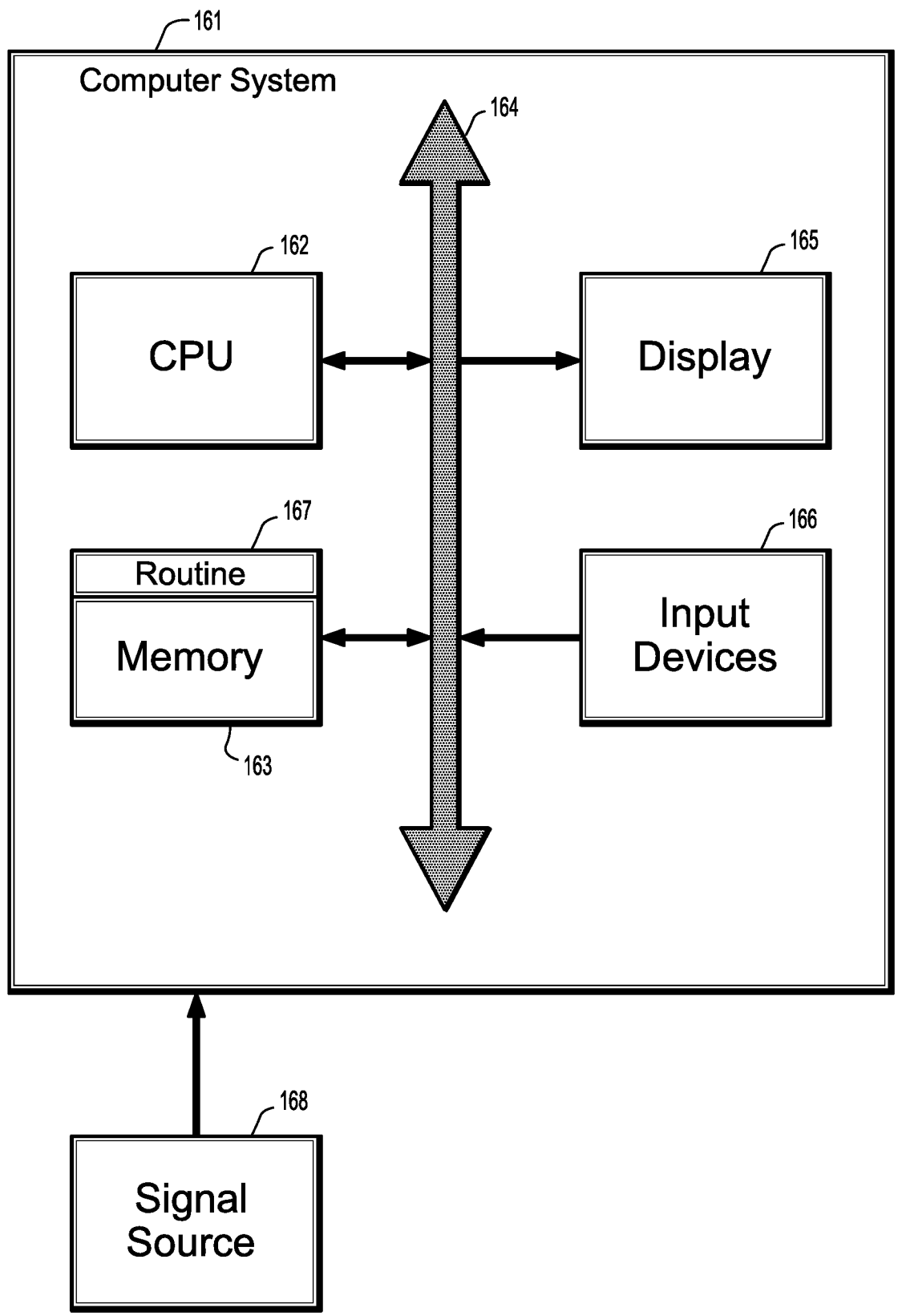
FIG. 16 is a block diagram of an exemplary computer system for implementing an eigenvector approach to coil sensitivity maps estimation for 2-D MR images, according to an embodiment of the invention.

FIG. 16 is a block diagram of an exemplary computer system for implementing an eigenvector approach to coil sensitivity maps (CSM) estimation for 2-D MR images according to an embodiment of the invention. Referring now to FIG. 16, a computer system 161 for implementing the present invention can comprise, inter alia, a central processing unit (CPU) 162, a memory 163 and an input/output (I/O) interface 164. The computer system 161 is generally coupled through the I/O interface 164 to a display 165 and various input devices 166 such as a mouse and a keyboard. The support circuits can include circuits such as cache, power supplies, clock circuits, and a communication bus. The memory 163 can include random access memory (RAM), read only memory (ROM), disk drive, tape drive, etc., or a combinations thereof. The present invention can be implemented as a routine 167 that is stored in memory 163 and executed by the CPU 162 to process the signal from the signal source 168. As such, the computer system 161 is a general purpose computer system that becomes a specific purpose computer system when executing the routine 167 of the present invention.

The computer system 161 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

APPENDIX

Proof of Theorem 1:
The proof begins with two technical lemmas.
Lemma 1:
Assume $n_x$ and $n_y$ are even numbers. Let A, B, P and Q denote $n_x \times n_y$ complex matrices, with the entry at the i-th row and the j-th column being $a_{i,j}$, $b_{i,j}$, $p_{i,j}$ and $q_{i,j}$, respectively. Let P and Q be the 2-D inverse Fourier transformations of A and B:

$$a_{m,n} = \sum_{u=1}^{n_x} \sum_{v=1}^{n_y} a_{u,v} \exp^{-2\pi j((u-1)m/n_x + (v-1)n/n_y)} / \sqrt{n_x n_y}, \quad (37)$$

$$q_{m,n} = \sum_{u=1}^{n_x} \sum_{v=1}^{n_y} b_{u,v} \exp^{-2\pi j((u-1)m/n_x + (v-1)n/n_y)} / \sqrt{n_x n_y}, \quad (38)$$

where $j = \sqrt{-1}$. If $$a_{u,v} = \overline{b_{n_x+2-u, n_y+2-v}}, \quad u=2, \ldots, n_x, \quad v=2, \ldots, n_y, \quad (39)$$

and $$q_{1,v} = a_{u,1} = b_{1,v} = b_{u,1} = 0, \quad u=1, \ldots, n_x, \quad v=1, \ldots, n_y, \quad (40)$$

one has $p_{m,n} = \overline{q_{m,n}}$, $m=1, \ldots, n_x$, $n=1, \ldots, n_y$.
Proof:
Inserting EQS. (39) and (40) into EQ. (37), one obtains EQ. (41):

$$p_{m,n} = \sum_{u=2}^{n_x} \sum_{v=2}^{n_y} \overline{b_{n_x+2-u, n_y+2-v}} \exp^{-2\pi j((u-1)m/n_x + (v-1)n/n_y)} / \sqrt{n_x n_y} \quad (41)$$

$$= \sum_{u'=2}^{n_x} \sum_{v'=2}^{n_y} \overline{b_{u',v'}} \exp^{-2\pi j((n_x+1-u')m/n_x + (n_y+1-v')n/n_y)} / \sqrt{n_x n_y}$$

$$= \sum_{u'=2}^{n_x} \sum_{v'=2}^{n_y} \overline{b_{u',v'}} \exp^{-2\pi j((1-u')m/n_x + (1-v')n/n_y)} / \sqrt{n_x n_y}$$

-continued $$= \sum_{u'=2}^{n_x} \sum_{v'=2}^{n_y} \overline{b_{u',v'} \exp^{-2\pi j((u'-1)m/n_x + (v'-1)n/n_y)}} / \sqrt{n_x n_y}$$

$$= \sum_{u'=1}^{n_x} \sum_{v'=1}^{n_y} \overline{b_{u',v'} \exp^{-2\pi j((u'-1)m/n_x + (v'-1)n/n_y)}} / \sqrt{n_x n_y}$$

$$= \overline{q_{m,n}}.$$

Lemma 2:
Let u and v denote $k_x k_y \times 1$ column vectors with complex entries. Let $u_t$ and $v_t$ denote the t-th elements of u and v, respectively. Define $$p = \sum_{t=1}^{k_x k_y} \mathscr{F}^H(\mathscr{P}_t(\overline{u_t}v)), \quad (42)$$

$$q = \sum_{t=1}^{k_x k_y} \mathscr{F}^H(\mathscr{P}_t(\overline{v_t}u)), \quad (43)$$

which are $n_x n_y \times 1$ column vectors. Then,
$$p = \overline{q}. \quad (44)$$

Proof:
Let $$a = \sum_{t=1}^{k_x k_y} \mathscr{P}_t(\overline{u_t}v), \quad (45)$$

$$b = \sum_{t=1}^{k_x k_y} \mathscr{P}_t(\overline{v_t}u). \quad (46)$$

Let A and B be $n_x \times n_y$ complex matrices that are the matrix version of a and b respectively. Making use of the definition of the zero padding operator, $$a_{u,v} = \overline{b_{n_x+2-u, n_y+2-v}}, \quad u=2, \ldots, n_x, \quad v=2, \ldots, n_y, \quad (47)$$

and $$a_{1,v} = a_{u,1} = b_{1,v} = b_{u,1} = 0, \quad u=1, \ldots, n_x, \quad v=1, \ldots, n_y. \quad (48)$$

Applying Lemma 2, one can verify EQ. (44).

Theorem 1 can now be proved. Denote $q_{j,i}^r$ as the j-th row and the i-th column of $S^r M^H$. It follows from EQS. (17) and (18) that $$q_{j,i}^r = \sum_{t=1}^{k_x k_y} s_{i,j,t}^r, \quad \forall r. \quad (49)$$

Denote $q_{j,i}$ as an $n_x \times n_y$ column vector with the r-th entry being $q_{j,i}^r$. Then $$q_{j,i} = \sum_{t=1}^{k_x k_y} s_{i,j,t}. \quad (50)$$

To prove that $S^r M^H$ is Hermitian, it suffices to verify $$q_{j,i} = \overline{q_{i,j}} \tag{51}$$

It follows from EQS. (9) and (10) that $$p_{i,j,t} = \sum_{k=1}^{T} \overline{v_{i,k}^t} v_{j,k}, \tag{52}$$

where $v_{i,k}^t$ denotes the t-th element in $v_{i,k}$. Therefore, $$q_{j,i} = \sum_{t=1}^{k_x k_y} \mathscr{F}^H(\mathscr{P}_t(p_{i,j,t})) \tag{53}$$

$$= \sum_{t=1}^{k_x k_y} \mathscr{F}^H\left(\mathscr{P}_t\left(\sum_{k=1}^{T} \overline{v_{i,k}^t} v_{j,k}\right)\right)$$

$$= \sum_{k=1}^{T} \left(\sum_{t=1}^{k_x k_y} \mathscr{F}^H(\mathscr{P}_t(\overline{v_{i,k}^t} v_{j,k}))\right).$$

By utilizing Lemma 2, one can obtain EQ (51).
Since $$\frac{M(S^r)^H}{k_x k_y}$$

is Hermitian, its eigenvalues are real. This ends the proof of this theorem.

Proof of Theorem 2:
For any pair of $\lambda$ and $\alpha$ that satisfy EQ. (20), left multiplying both sides of EQ. (20) by M yields $$M(S^r)^H \alpha = \lambda M M^H \alpha = \lambda k_x k_y \alpha \tag{54}$$

where $MM^H = k_x k_y I$ was used for establishing the last equality. Therefore, $\lambda$ and $\alpha$ are also the eigenvalue and eigenvector of EQ. (21), respectively.

Proof of Theorem 3:
For any pair of $\lambda$ and $\alpha$ that satisfy EQ. (20), left multiplying both sides of EQ. (20) by $S^r$ yields $$S^r(S^r)^H \alpha = \lambda S^r M^H \alpha = \lambda^2 k_x k_y \alpha \tag{55}$$

where Theorem 2 establishes the second equality. Therefore, $\lambda$ and $\alpha$ are also the eigenvalue and eigenvector of EQ. (22), respectively.

For any pair of $\lambda$ and $\alpha$ that satisfy EQ. (25), $$S^r(S^r)^H M M^H \alpha = (\lambda k_x k_y)^2 \alpha = S^r M^H S^r M^H \alpha \tag{56}$$

where $MM^H = k_x k_y I$ and $(S^r)^H M = M^H S^r$ have been used (see Theorem 1). The last equality in EQ. (56) indicates that $\alpha$ is the eigenvector of $S^r M^H S^r M^H$ corresponding to eigenvalue $(\lambda k_x k_y)^2$.

Proof of Theorem 4:
The proof begins with a technical lemma, whose proof is omitted here.

Lemma 3:
$F^H(P_t(v_{j,k})) \otimes \overline{F^H(P_t(v_{j',k'}))}$ is invariant to the spatial location t, i.e., $F^H(P_t(v_{j,k})) \otimes \overline{F^H(P_t(v_{j',k'}))} = F^H(P_t(v_{j,k})) \otimes \overline{F^H(P_t(v_{j',k'}))}$.

Now, the theorem may be proved. The j-th row and j'-th column of $S^r(S^r)^H$ can be computed as $$\sum_{i=1}^{n_c} m^r_{i,j,j'}, \tag{57}$$

where $$m^r_{i,j,j'} = \sum_{t=1}^{k_x k_y} s^r_{i,j,t} \overline{s^r_{i,j',t}}, \forall r. \tag{58}$$

EQ. (58) can be rewritten as the following matrix format:

$$m_{i,j,j'} = \sum_{t=1}^{k_x k_y} s_{i,j,t} \otimes \overline{s_{i,j',t}}. \tag{59}$$

Inserting EQ. (52) into EQ. (15) yields $$s_{i,j,t} = F^H(P_t(p_{i,j,t})) = \sum_{k=1}^{\tau} \overline{v_{i,k}^t} F^H(P_t(v_{j,k})) \tag{60}$$

In computing $s_{i,j,t} \otimes \overline{s_{i,j',t}}$, a useful operation is $$F^H(P_t(v_{j,k})) \otimes \overline{F^H(P_t(v_{j',k'}))} \tag{61}$$

which is identical to $$F^H(P_c(v_{j,k})) \otimes \overline{F^H(P_c(v_{j',k'}))}, \tag{62}$$

using Lemma 3.

Let $\Gamma^r_{j,j'}$ be a $\tau \times \tau$ matrix whose k-th row and k'-th column are the value of $z^r_{j,k} \overline{z^r_{j',k'}}$. Denote $v_{i,:}$ as the i-th row of $V_{\|}$. Then $$m_{i,j,j'}^r = k_x k_y \overline{v_{i,:}} \Gamma^r_{j,j'} \overline{v_{i,:}^H}. \tag{63}$$

It is interesting to note that $$\sum_{i=1}^{n_c} m^r_{i,j,j'} = k_x k_y \sum_{i=1}^{n_c} \overline{v_{i,:}} \Gamma^r_{j,j'} \overline{v_{i,:}^H} \tag{64}$$

$$= k_x k_y \sum_{i=1}^{n_c} \text{trace}(\Gamma^r_{j,j'} \overline{v_{i,:}^H v_{i,:}})$$

$$= k_x k_y \text{trace}\left(\Gamma^r_{j,j'} \sum_{i=1}^{n_c} \overline{v_{i,:}^H v_{i,:}}\right)$$

$$= k_x k_y \text{trace}(\Gamma^r_{j,j'})$$

$$= k_x k_y \sum_{k=1}^{T} z^r_{j,k} \overline{z^r_{j,k}},$$

where trace (A) denotes the summation of the diagonal entries of a matrix A. Therefore, EQ. (32) holds. □

What is claimed is:
1. A method for reconstructing a magnetic resonance (MR) image m, comprising the steps of:
   acquiring coil calibration data from a magnetic resonance imaging apparatus;
   constructing a matrix $A=\{a_{ij}\}$ of real numbers from 3D sliding blocks of a 3D $c_x \times c_y \times c_z$ image of said coil calibration data, wherein $c_x$, $c_y$, and $c_z$ are the x, y and z dimensions, respectively, of the coil calibration data, A has $[(c_x-k_x+1) \times (c_y-k_y+1) \times (c_z-k_z+1)]$ columns and $k_x k_y k_z n_c$ rows, wherein $k_x$, $k_y$, $k_z$ are the x, y, and z dimensions, respectively, of the sliding blocks, $n_c$ is a number of coils, i and j are row and column indices of elements a of matrix A, and $a_{i,j}$ is a $k_x k_y k_z \times 1$ column vector that represents a jth sliding block of an ith coil;

calculating a left singular matrix $V_\|$ from a singular value decomposition of A, wherein $$V_\|[v_1, v_2, \ldots, v_\tau] = \begin{pmatrix} v_{1,1} & v_{1,2} & \ldots & v_{1,\tau} \\ v_{2,1} & v_{2,2} & \ldots & v_{2,\tau} \\ \ldots & \ldots & & \ldots \\ v_{n_c,1} & v_{n_c,2} & \ldots & v_{n_c,\tau} \end{pmatrix}$$

comprises left singular vectors of A corresponding to $\tau$ leading singular values wherein H denotes a complex-conjugate transpose, $v_{i,k}$ is a $k_x k_y k_z \times 1$ column vector obtained by concatenating columns that is an i-th block in vector $v_k$ wherein $v_k$ k=1, 2, ..., $\tau$, is a component of $V_\|$;

calculating $$P = V_\| V_\|^H =$$

$$\left( \begin{pmatrix} p_{1,1,1} & p_{1,1,2} & \ldots & p_{1,1,k_x k_y k_z} \\ p_{1,1,1} & p_{1,2,2} & \ldots & p_{1,2,k_x k_y k_z} \\ \ldots & \ldots & & \ldots \\ p_{1,n_c,1} & p_{1,n_c,2} & \ldots & p_{1,n_c,k_x k_y k_z} \end{pmatrix} \ldots \begin{pmatrix} p_{n_c,1,1} & \ldots & p_{n_c,1,k_x k_y k_z} \\ p_{n_c,2,1} & \ldots & p_{n_c,2,k_x k_y k_z} \\ \ldots & & \ldots \\ p_{n_c,n_c,1} & \ldots & p_{n_c,n_c,k_x k_y k_z} \end{pmatrix} \right)$$

wherein $p_{i,j,t}$ is a $k_x k_y k_z \times 1$ column vector;

calculating $s_{i,j,t} = F^H(P_t(p_{i,j,t}))$ wherein $F^H$ represents an inverse Fourier transform and $P_t$ represents a zero-padding operator;

solving $M^H c^r = (S^r)^H c^r$ for $c^r$ from $$c^r = \underset{\alpha \|\alpha\|_2 = 1}{\mathrm{argmax}} \langle (S^r)^H \alpha, M^H \alpha \rangle,$$

where $c^r$ is a vector of coil sensitivity maps for all coils, $c_i$, at spatial location r, where $c_i$ denotes a coil sensitivity map for the i-th coil, $\alpha$ is an $n_c \times 1$ column vector representing a generalized eigenvector, $S^r$ is a vector of matrices of values $s_{i,j,t}$ at a spatial location r in the image, $$S^r = \left( \begin{pmatrix} s^r_{1,1,1} & s^r_{1,1,2} & \ldots & s^r_{1,1,k_x k_y k_z} \\ s^r_{1,2,1} & s^r_{1,2,2} & & s^r_{1,2,k_x k_y k_z} \\ \ldots & \ldots & \ldots & \ldots \\ s^r_{1,n_c,1} & s^r_{1,n_c,2} & \ldots & s^r_{1,n_c,k_x k_y k_z} \end{pmatrix} \ldots \begin{pmatrix} s^r_{n_c,1,1} & \ldots & s^r_{n_c,1,k_x k_y k_z} \\ s^r_{n_c,2,1} & \ldots & s^r_{n_c,2,k_x k_y k_z} \\ \ldots & & \ldots \\ s^r_{n_c,n_c,1} & \ldots & s^r_{n_c,n_c,k_x k_y k_z} \end{pmatrix} \right)$$

and $$M = \left( \begin{pmatrix} 1 & 1 & \ldots & 1 \\ 0 & 0 & \ldots & 0 \\ \ldots & \ldots & & \ldots \\ 0 & 0 & \ldots & 0 \end{pmatrix} \begin{pmatrix} 0 & 0 & \ldots & 0 \\ 1 & 1 & \ldots & 1 \\ \ldots & \ldots & & \ldots \\ 0 & 0 & \ldots & 0 \end{pmatrix} \ldots \begin{pmatrix} 0 & 0 & \ldots & 0 \\ 0 & 0 & \ldots & 0 \\ \ldots & \ldots & & \ldots \\ 1 & 1 & \ldots & 1 \end{pmatrix} \right);$$

and reconstructing the MR image m from data acquired from a subject by said magnetic resonance imaging apparatus by using respective coil sensitivity maps $c_j$ to generate a reconstructed MR image $\hat{m}$ that minimizes artifacts for the respective coil sensitivity maps of respective coils by solving an optimization equation $$\hat{m} = \min_m \frac{1}{2} \sum_{i=1}^{n_S} \|F_u(c_j \otimes m) - yi\|_2^2 + \lambda \|Wm\|_1,$$

wherein $F_u$ is an under-sampling Fourier transformation operator, m denotes an iterative image to be reconstructed, $y_i$ represents observed undersampled k-space data for the i-th coil, W is a redundant Haar wavelet transformation, and $\lambda$ is a weighting factor.

2. The method of claim 1, further comprising finding an optimizer $c^r$ that maximizes a correlation between $(S^r)^H \alpha$ and $M^H \alpha$ wherein said optimizer $c^r$ is the vector of coil sensitivity maps for all coils at spatial location r in the 3D image.

3. The method of claim 1, wherein solving $M^H C^r = (S^r)^H c^r$ for $c^r$ comprises solving eigenvalue equations $$\frac{M(S^r)^H}{k_x k_y k_z} \beta = \bar{\lambda} \beta, \text{ and } (S^r(S^r)^H) \gamma = \tilde{\lambda} \gamma,$$

wherein $\bar{\lambda}$ and $\tilde{\lambda}$ denote eigenvalues, and $\beta$ and $\gamma$ denote eigenvectors.

4. The method of claim 3, further comprising calculating $S^r M^H$ using $$m_{i,j} = \sum_{t=1}^{k_x k_y k_z} s_{i,j,t} = \sum_{t=1}^{k_x k_y k_z} F^H(P_t(p_{i,j,t})) = F^H \left( \sum_{t=1}^{k_x k_y k_z} P_t(p_{i,j,t}) \right),$$

wherein $$m_{i,j}^r = \sum_{t=1}^{k_x k_y} s_{i,j,t}^r, \forall r,$$

where $m_{i,j}^r$ is an i,j element at spatial location r, $m_{i,j}$ is an $c_x \times c_y \times c_z \times 1$ column vector containing the entries of $m_{i,j}^r$ at all spatial locations, wherein $c_x$, $c_y$ and $c_z$ are dimensions of the 3D image, and $m_{i,j}^r$ is the i,j elements of the 3D MR image at spatial location r.

5. The method of claim 3, further comprising calculating $S^r(S^r)^H$ as $S^r(S^r)^H = k_x k_y k_z Z^r(Z^r)^H$, wherein $$Z^r = \begin{pmatrix} z_{1,1}^r & z_{1,2}^r & & z_{1,\tau}^r \\ z_{2,1}^r & z_{2,2}^r & & z_{2,\tau}^r \\ \ldots & & & \ldots \\ z_{n_c,1}^r & z_{n_c,2}^r & & z_{n_c,\tau}^r \end{pmatrix}$$

is an $n_c \times \tau$ matrix with the j-row and k-th column being $z_{j,k}^r$, $z_{j,k}^r$ denotes the r-th entry of $z_{j,k} = F^H(P_c(v_{j,k}))$, and $P_c$ denotes the zero-padding operator that maps a center of $v_{j,k}$ to a center of $z_{j,k}$.

6. The method of claim 5, further comprising computing the i-th row and j-th column of $Z^r(Z^r)^H$ as $$\sum_{k=1}^{\tau} z_{i,k}^r \overline{z_{i,k}^r}$$

wherein $z_{i,k}^r$ denotes the i-th row and k-th column in $Z^r$.

7. The method of claim 1, wherein the coil calibration data is acquired from a center square of frequency space data.

8. A non-transitory program storage device readable by a computer, tangibly embodying a program of instructions executed by the computer to perform the method steps for reconstructing a magnetic resonance (MR) image m, the method comprising the steps of:

constructing a matrix $A=\{a_{ij}\}$ of real numbers from 3D sliding blocks of kernel size $k_x \times k_y \times k_z$ of a 3D $c_x \times c_y \times c_z$ image of coil calibration data acquired from a magnetic resonance imaging apparatus, wherein $c_x$, $c_y$, and $c_z$ are the x, y and z dimensions, respectively, of the coil calibration data, $k_x$, $k_y$, $k_z$ are the x, y, and z dimensions, respectively, of the sliding blocks, wherein A has $[(c_x-k_x+1)\times(c_y-k_y+1)\times(c_z-k_z+1)]$ columns and $k_x k_y k_z n_c$ rows, n is a number of coils, i and j are row and column indices of elements a of matrix A, and $a_{i,j}$ is a $k_x k_y k_z \times 1$ column vector obtained by concatenating columns that represents a jth sliding block of an ith coil;

calculating a left singular matrix $V_\parallel$ from a singular value decomposition of A, wherein $$V_\parallel = [v_1, v_2, \ldots, v_\tau] = \begin{pmatrix} v_{1,1} & v_{1,2} & \cdots & v_{1,\tau} \\ v_{2,1} & v_{2,2} & \cdots & v_{2,\tau} \\ \cdots & \cdots & & \cdots \\ v_{n_c,1} & v_{n_c,2} & \cdots & v_{n_c,\tau} \end{pmatrix}$$

comprises left singular vectors of A corresponding to T leading singular values wherein H denotes a complex-conjugate transpose, $v_{i,k}$ is a $k_x k_y k_z \times 1$ column vector obtained by concatenating columns that is an i-th block in vector $v_k$ wherein $v_k$, $k=1, 2, \ldots, \tau$, is a component of $V_\parallel$;

calculating $$P = V_\parallel V_\parallel^H =$$

$$\begin{pmatrix} \begin{pmatrix} p_{1,1,1} & p_{1,1,2} & \cdots & p_{1,1,k_xk_yk_z} \\ p_{1,1,1} & p_{1,2,2} & \cdots & p_{1,2,k_xk_yk_z} \\ \cdots & \cdots & \cdots & \cdots \\ p_{1,n_c,1} & p_{1,n_c,2} & \cdots & p_{1,n_c,k_xk_yk_z} \end{pmatrix} \cdots \begin{pmatrix} p_{n_c,1,1} & \cdots & p_{n_c,1,k_xk_yk_z} \\ p_{n_c,2,1} & \cdots & p_{n_c,2,k_xk_yk_z} \\ \cdots & \cdots & \cdots \\ p_{n_c,n_c,1} & \cdots & p_{n_c,n_c,k_xk_yk_z} \end{pmatrix} \end{pmatrix}$$

wherein $p_{i,j,t}$ is a $k_x k_y k_z \times 1$ column vector;

calculating $s_{i,j,t}=F^H(P_t(p_{i,j,t}))$ wherein $F^H$ represents an inverse Fourier transform and $P_t$ represents a zero-padding operator;

solving $M^H C^r = (S^r)^H c^r$, from $$c^r = \underset{\alpha \|\alpha\|_2 = 1}{\operatorname{argmax}} \langle (S^r)^H \alpha, M^H \alpha \rangle$$

where $c^r$ is a vector of coil sensitivity maps for all coils, $c_i$, at spatial location r, where $c_i$ denotes a coil sensitivity map for the i-th coil, $\alpha$ is an $n_c \times 1$ column vector representing a generalized eigenvector, $S^r$ is a vector of matrices of values $s_{i,j,t}$ at a spatial location r in the image, $$S^r = \begin{pmatrix} \begin{pmatrix} s^r_{1,1,1} & s^r_{1,1,2} & \cdots & s^r_{1,1,k_xk_yk_z} \\ s^r_{1,2,1} & s^r_{1,2,2} & & s^r_{1,2,k_xk_yk_z} \\ \cdots & \cdots & \cdots & \cdots \\ s^r_{1,n_c,1} & s^r_{1,n_c,2} & \cdots & s^r_{1,n_c,k_xk_yk_z} \end{pmatrix} \cdots \begin{pmatrix} s^r_{n_c,1,1} & \cdots & s^r_{n_c,1,k_xk_yk_z} \\ s^r_{n_c,2,1} & \cdots & s^r_{n_c,2,k_xk_yk_z} \\ \cdots & \cdots & \cdots \\ s^r_{n_c,n_c,1} & \cdots & s^r_{n_c,n_c,k_xk_yk_z} \end{pmatrix} \end{pmatrix}$$

and $$M = \begin{pmatrix} \begin{pmatrix} 1 & 1 & \cdots & 1 \\ 0 & 0 & \cdots & 0 \\ \cdots & \cdots & & \cdots \\ 0 & 0 & \cdots & 0 \end{pmatrix} \begin{pmatrix} 0 & 0 & \cdots & 0 \\ 1 & 1 & \cdots & 1 \\ \cdots & \cdots & & \cdots \\ 0 & 0 & \cdots & 0 \end{pmatrix} \cdots \begin{pmatrix} 0 & 0 & \cdots & 0 \\ 0 & 0 & \cdots & 0 \\ \cdots & \cdots & & \cdots \\ 1 & 1 & \cdots & 1 \end{pmatrix} \end{pmatrix};$$

and reconstructing the MR image m from data acquired from a subject by said magnetic resonance imaging apparatus by using respective coil sensitivity maps $c_j$ to generate a reconstructed MR image $\hat{m}$ that minimizes artifacts by solving an optimization equation $$\hat{m} = \min_m \frac{1}{2} \sum_{i=1}^{n_c} \|F_u(c_j \otimes m) - y_i\|_2^2 + \lambda \|Wm\|_1,$$

wherein $F_u$ is an under-sampling Fourier transformation operator, m denotes an iterative image to be reconstructed, $y_i$ represents observed undersampled k-space data for the i-th coil, W is a redundant Haar wavelet transformation, and $\lambda$ is a weighting factor.

9. The computer readable program storage device of claim 8, the method further comprising finding an optimizer $c^r$ that maximizes a correlation between $(S^r)^H \alpha$ and $M_H \alpha$ wherein said optimizer $c^r$ is the vector of coil sensitivity maps for all coils at spatial location r in the 3D image.

10. The computer readable program storage device of claim 8, wherein solving $M^H c^r = (S^r)^H c^r$ for $c^r$ comprises solving eigenvalue equations $$\frac{M(S^r)^H}{k_x k_y k_z} \beta = \tilde{\lambda}\beta, \text{ and } (S^r(S^r)^H)\gamma = \tilde{\lambda}\gamma,$$

wherein $\tilde{\lambda}$ and $\tilde{\lambda}$ denote eigenvalues, and p and y denote eigenvectors.

11. The computer readable program storage device of claim 10, the method further comprising calculating $S^r M^H$ using $$m_{i,j} = \sum_{t=1}^{k_x k_y k_z} s_{i,j,t} = \sum_{t=1}^{k_x k_y k_z} F^H(P_t(p_{i,j,t})) = F^H\left(\sum_{t=1}^{k_x k_y k_z} P_t(p_{i,j,t})\right),$$

wherein $$m^r_{i,j} = \sum_{t=1}^{k_x k_y} s^r_{i,j,t}, \forall r,$$

where $m_{i,j}^r$ is an i,j element at spatial location r, $m_{i,j}$ is an $x_x \times c_y \times c_z \times 1$ column vector containing the entries of $m_{i,j}^r$ at all spatial locations, and $m_{i,j}^r$ is the i,j elements of the 3D MR image at spatial location r.

12. The computer readable program storage device of claim 10, further comprising calculating $S^r(S^r)^H$ as $S^r(S^r)^H = k_x k_y k_z Z^r(Z^r)^H$, wherein $$Z^r = \begin{pmatrix} z^r_{1,1} & z^r_{1,2} & & z^r_{1,\tau} \\ z^r_{2,1} & z^r_{2,2} & & z^r_{2,\tau} \\ & & & \\ z^r_{n_c,1} & z^r_{n_c,2} & & z^r_{n_c,\tau} \end{pmatrix}$$

is an $n_c \times \tau$ matrix with the j-row and k-th column being $z_{j,k}^r$, $z_{j,k}^r$ denotes the r-th entry of $z_{j,k} = F^H(P_c(v_{j,k}))$, and $P_c$ denotes the zero-padding operator that maps a center of $v_{j,k}$ to a center of $z_{j,k}$.

13. The computer readable program storage device of claim 12, the method further comprising computing the i-th row and j-th column of $Z^r(Z^r)^H$ as $$\sum_{k=1}^{\tau} z^r_{i,k} \overline{z^r_{i,k}}$$

wherein $z_{i,k}^r$ denotes the i-th row and k-th column in $Z^r$.

14. The computer readable program storage device of claim 8, wherein the coil calibration data is acquired from a center square of frequency space data.

\* \* \* \* \*